(12) United States Patent
Kim et al.

(10) Patent No.: US 12,224,296 B2
(45) Date of Patent: Feb. 11, 2025

(54) IMAGE SENSOR INCLUDING A PIXEL SEPARATION STRUCTURE

(71) Applicant: SAMSUNG ELECTRONICS CO., LTD., Suwon-si (KR)

(72) Inventors: Hongki Kim, Hwaseong-si (KR); Changrok Moon, Seoul (KR); Taehyong Kim, Suwon-si (KR); Seungjae Oh, Suwon-si (KR); Jihyun Kwak, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 640 days.

(21) Appl. No.: 17/511,754

(22) Filed: Oct. 27, 2021

(65) Prior Publication Data

US 2022/0165774 A1    May 26, 2022

(30) Foreign Application Priority Data

Nov. 25, 2020 (KR) ........................ 10-2020-0160383

(51) Int. Cl.
*H01L 27/146* (2006.01)

(52) U.S. Cl.
CPC .. *H01L 27/14625* (2013.01); *H01L 27/14685* (2013.01); *H01L 27/1463* (2013.01); *H01L 27/14649* (2013.01)

(58) Field of Classification Search
CPC ................................................ H01L 27/14625
USPC ........................................................ 257/432
See application file for complete search history.

(56) References Cited

U.S. PATENT DOCUMENTS

| 9,466,629 | B2 | 10/2016 | Yoon et al. |
| 9,608,024 | B2 | 3/2017 | Lee et al. |
| 9,748,299 | B2 | 8/2017 | Ahn et al. |
| 9,923,009 | B1 | 3/2018 | Hsiung et al. |
| 10,181,490 | B2 | 1/2019 | Watanabe et al. |

(Continued)

FOREIGN PATENT DOCUMENTS

| CN | 108022939 | 5/2018 |
| CN | 108695347 | 10/2018 |

OTHER PUBLICATIONS

OmniVision OS02c10,1/2.8" Optical Format, 2MP, 29μm Pixel Pitch, Stacked BI-CIS with Nyxel® 2NIR and ULL Technologies for Security, Action, and Consumer Camera Applications, 4 pages.

*Primary Examiner* — Ajay Arora
(74) *Attorney, Agent, or Firm* — F. CHAU & ASSOCIATES, LLC

(57) ABSTRACT

An image sensor includes: a semiconductor substrate that has a first surface and a second surface opposite to each other. The semiconductor substrate includes: a first trench that vertically extends from the first surface of the semiconductor substrate and provides a pixel region, and a second trench that vertically extends from the first surface of the semiconductor substrate and is disposed on the pixel region. The image sensor further includes: a pixel separation structure that vertically extends from the second surface of the semiconductor substrate and overlaps the first trench; and a gap-fill dielectric layer disposed on the first surface of the semiconductor substrate, wherein the gap-fill dielectric layer includes a pixel separation part and a scattering pattern part, wherein the pixel separation part is disposed in the first trench, and the scattering pattern part is disposed in the second trench.

20 Claims, 24 Drawing Sheets

(56) References Cited

U.S. PATENT DOCUMENTS

| | | |
|---|---|---|
| 10,204,951 B2 | 2/2019 | Watanabe et al. |
| 10,263,030 B2 | 4/2019 | Borthakur et al. |
| 2014/0246707 A1* | 9/2014 | Koo .................... H01L 27/1464 |
| | | 257/230 |
| 2017/0047363 A1 | 2/2017 | Choi et al. |
| 2018/0286895 A1 | 10/2018 | Watanabe et al. |
| 2019/0252425 A1 | 8/2019 | Ogawa |
| 2019/0296070 A1 | 9/2019 | Jin et al. |
| 2024/0258350 A1* | 8/2024 | Park .................. H01L 27/14609 |

\* cited by examiner

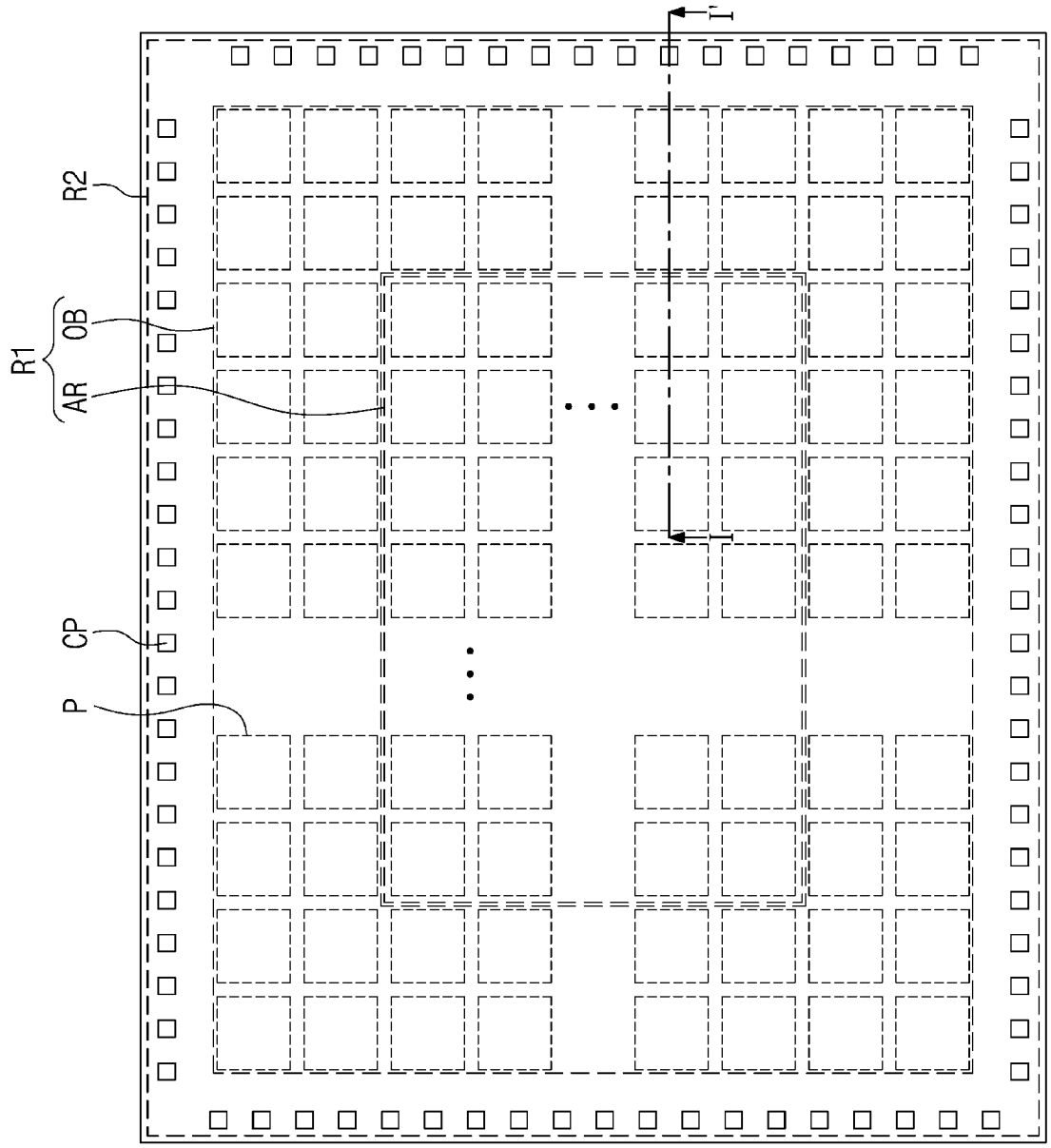

IMAGE SENSOR INCLUDING A PIXEL SEPARATION STRUCTURE

CROSS-REFERENCE TO RELATED APPLICATION

This U.S. nonprovisional application claims priority under 35 U.S.C § 119 to Korean Patent Application No. 10-2020-0160383, filed on Nov. 25, 2020, in the Korean Intellectual Property Office, the disclosure of which is incorporated by reference herein in its entirety.

TECHNICAL FIELD

The present inventive concept relates to an image sensor, and more particularly, to an image sensor including a pixel separation structure.

DISCUSSION OF THE RELATED ART

An image sensor converts photonic images into electrical signals. Recent advances in computer and communication industries have led to an increased desire in high performances image sensors in various consumer electronic devices such as digital cameras, camcorders, PCSs (personal communication systems), game consoles, security cameras, and medical micro-cameras.

An image sensor may be classified as a charged coupled device (CCD) and a CMOS image sensor. The CMOS image sensor has a relatively simple operating method, and a size of the electronic device including the CMOS image sensor may be minimized because the CMOS image sensor's signal processing circuit is integrated into a single chip. In addition, the CMOS image sensor has relatively small power consumption, which is useful in a battery-powered application. In addition, since process technology of manufacturing CMOS image sensors is compatible with CMOS process technology, the fabrication cost of the CMOS image sensors may be decreased. Accordingly, the use of the CMOS image sensor has been rapidly increasing as a result of advancements in technology and an implementation of high resolution.

SUMMARY

According to an exemplary embodiment of the present inventive concept, an image sensor includes: a semiconductor substrate that has a first surface and a second surface opposite to each other. The semiconductor substrate includes: a first trench that vertically extends from the first surface of the semiconductor substrate and provides a pixel region, and a second trench that vertically extends from the first surface of the semiconductor substrate and is disposed on the pixel region. The image sensor further includes: a pixel separation structure that vertically extends from the second surface of the semiconductor substrate and overlaps the first trench; and a gap-fill dielectric layer disposed on the first surface of the semiconductor substrate, wherein the gap-fill dielectric layer includes a pixel separation part and a scattering pattern part, wherein the pixel separation part is disposed in the first trench, and the scattering pattern part is disposed in the second trench.

According to an exemplary embodiment of the present inventive concept, an image sensor includes: a semiconductor substrate that has a first surface and a second surface opposite to each other; a first pixel separation structure that vertically extends from the first surface of the semiconductor substrate and provides a pixel region. The first pixel separation structure includes: a plurality of first parts that extend in a first direction, a plurality of second parts that extend in a second direction intersecting the first direction, and a plurality of first intersection parts that are connected to the plurality of first and the plurality of second parts. The image sensor further includes a second pixel separation structure that overlaps the first pixel separation structure and vertically extends from the second surface of the semiconductor substrate. The second pixel separation structure includes: a plurality of third parts that extend in the first direction, a plurality of fourth parts that extend in the second direction, and a plurality of second intersection parts that are connected to the plurality of third and the plurality of fourth parts, wherein the plurality of first and the plurality of second parts have a first vertical length, and the first intersection parts have a second vertical length different from the first vertical length, and wherein the plurality of third and the plurality of fourth parts have a third vertical length, and that the plurality of second intersection parts have a fourth vertical length different from the third vertical length.

According to an exemplary embodiment of the present inventive concept, an image sensor includes: a semiconductor substrate that has a first surface and a second surface opposite to each other, wherein the semiconductor substrate includes a light-receiving region, a light-shielding region, and a pad region; a first pixel separation structure that vertically extends from the first surface of the semiconductor substrate on the light-receiving, light-shielding, and pad regions; a second pixel separation structure that vertically extends from the second surface of the semiconductor substrate on the light-receiving, light-shielding, and pad regions; wherein the second pixel separation structure overlaps the first pixel separation structure; a plurality of photoelectric conversion regions in the semiconductor substrate on the light-receiving and light-shielding regions; a plurality of scattering patterns in the second surface of the semiconductor substrate on the light-receiving and light-shielding regions, wherein the scattering patterns overlap the plurality of photoelectric conversion regions; a contact plug disposed on a portion of the light-shielding region, wherein the contact plug is adjacent to the second surface of the semiconductor substrate and is in contact with a portion of the first pixel separation structure; a conductive pad disposed on the second surface of the semiconductor substrate and on the pad region; a grid structure disposed on the second surface of the semiconductor substrate; and a microlens array disposed on the grid structure.

BRIEF DESCRIPTION OF THE DRAWINGS

FIG. 1 illustrates a plan view showing an image sensor according to an exemplary embodiment of the present inventive concept.

DETAILED DESCRIPTION OF THE EMBODIMENTS

Figure 2A:
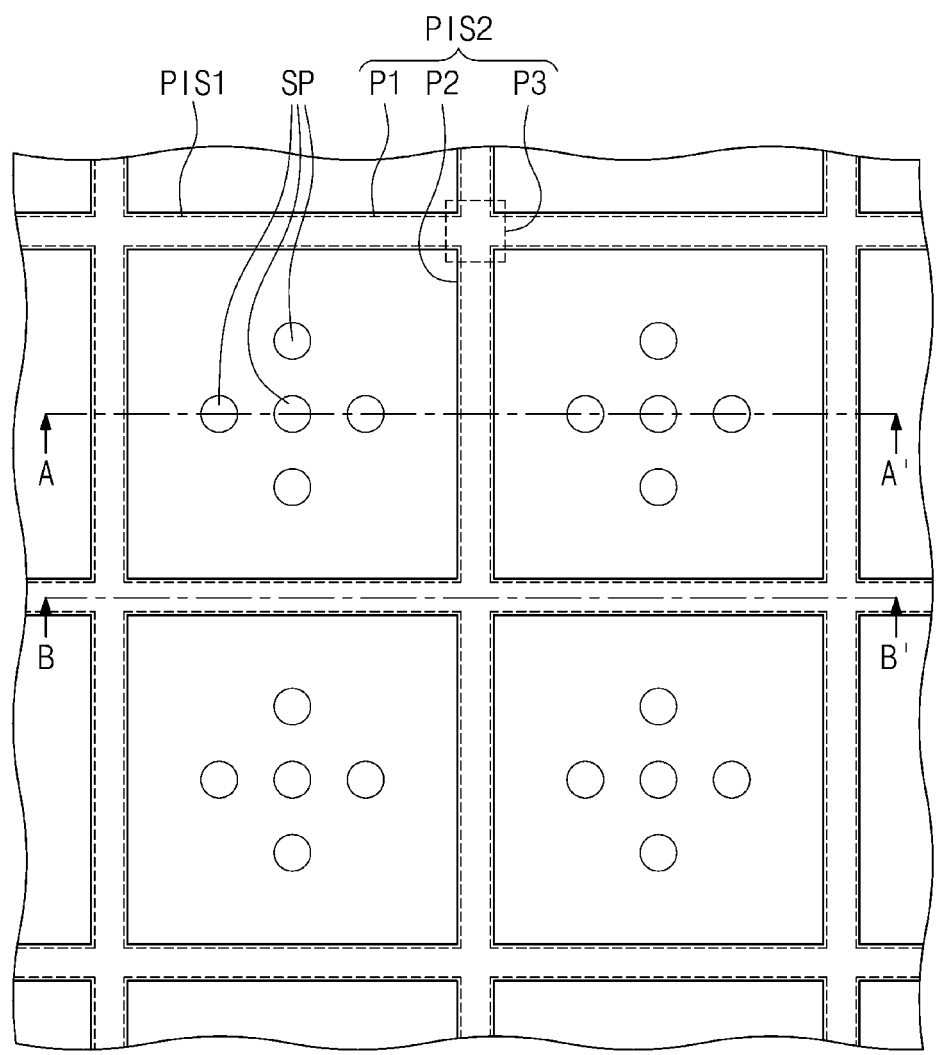
FIGS. 2A and 2B illustrate plan views partially showing an image sensor according to an exemplary embodiment of the present inventive concept.

Hereinafter an image sensor and a method of fabricating the same according to an exemplary embodiment of the present inventive concept will be described more fully with reference to the accompanying drawings.

It will be understood that spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, in the example, terms "below" and "beneath" may encompass both an orientation of above, below and beneath. The device may be otherwise oriented (e.g., rotated 90 degrees or at other orientations) and the spatially relative descriptors used herein may be interpreted accordingly.

FIG. 1 illustrates a plan view showing an image sensor according to an exemplary embodiment of the present inventive concept.

Referring to FIG. 1, an image sensor may include a pixel array region R1 and a pad region R2.

The pixel array region R1 may include a plurality of unit pixels P that are two-dimensionally arranged along a first direction D1 and a second direction D2. Each of the unit pixels P may include a photoelectric conversion element and readout elements. Each unit pixel P of the pixel array region R1 may output electrical signals converted from incident light.

The pixel array region R1 may include a light-receiving region AR and a light-shielding region OB. From a plan view, the light-shielding region OB may at least partially surround the light-receiving region AR. For example, when viewed from a plan view, the light-shielding region OB may be disposed on all of the sides of the light-receiving region AR. The light-shielding region OB may include reference pixels on which no or little light is incident, and an amount of charges sensed in the unit pixels P of the light-receiving region AR may be compared with a reference amount of charges occurring at reference pixels, which may result in obtaining magnitudes of electrical signals sensed in the unit pixels P.

The pad region R2 may include a plurality of conductive pads CP used for input and output of control signals and photoelectric conversion signals. For easy connection with external devices, when viewed in a plan view, the pad region R2 may at least partially surround the pixel array region R1. The conductive pads CP may allow an external device to receive electrical signals generated from the unit pixels P.

The image sensor according to an exemplary embodiment of the present inventive concept may use an infrared ray to detect light reflected from an object and may output optical depth information of the object. As such, like operations of infrared cameras, the optical depth information obtained from the image sensor may be utilized to achieve a three-dimensional image. In addition, a three-dimensional color image may be accomplished by using an image sensor including infrared-light pixels and visible-light pixels.

Figure 2B:
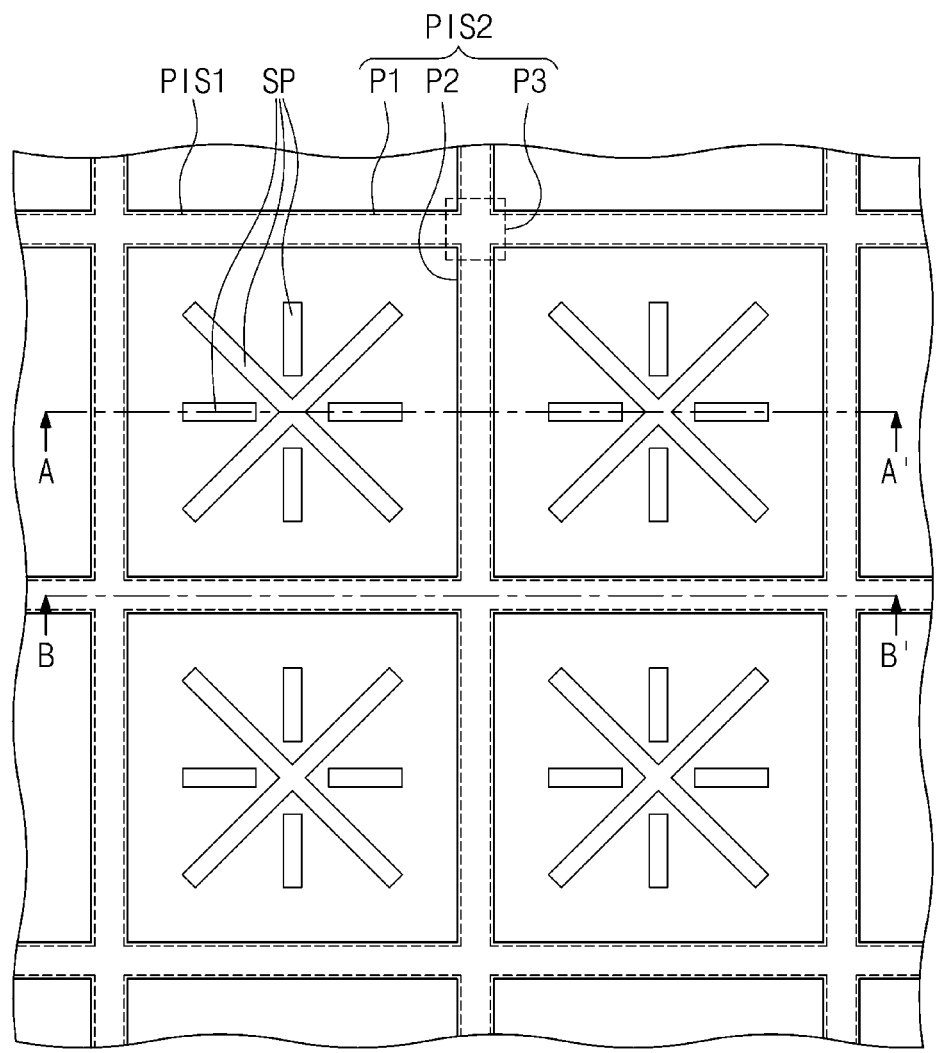
Figure 3A:
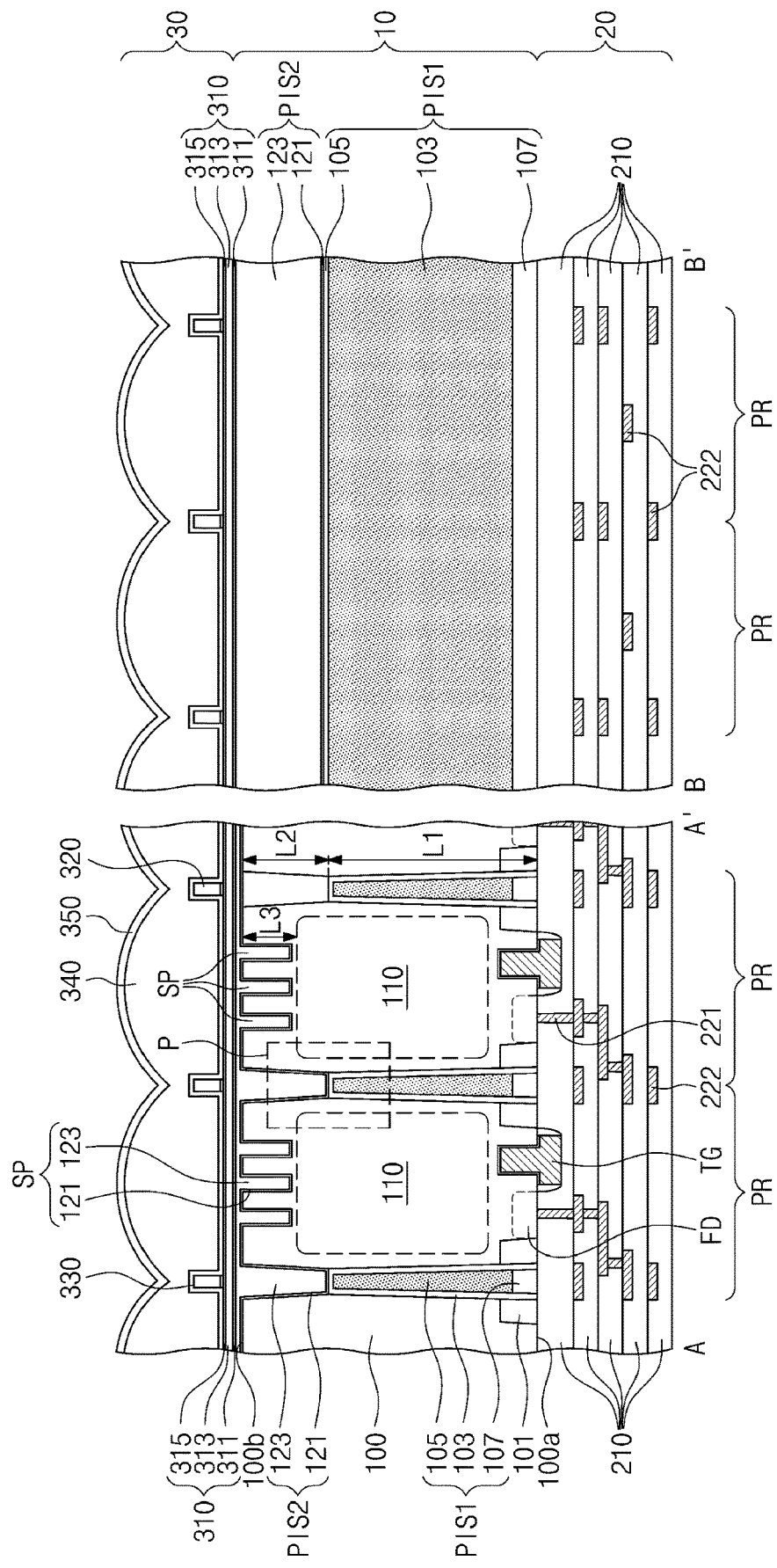
FIGS. 3A, 3B, and 3C illustrate cross-sectional views taken along lines A-A' and B-B' of FIG. 2A, showing an image sensor according to an exemplary embodiment of the present inventive concept.
Figure 3B:
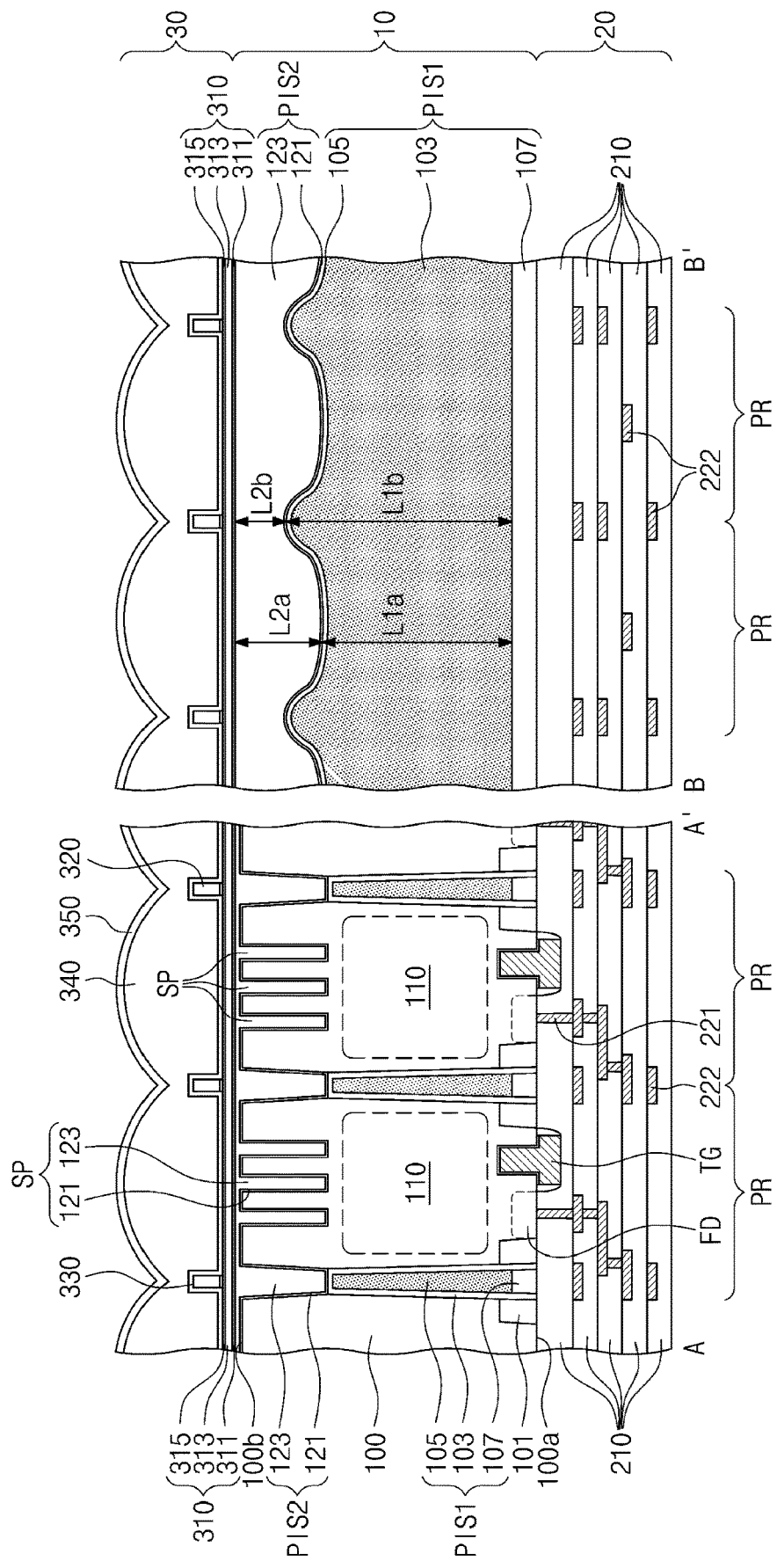
Figure 3C:
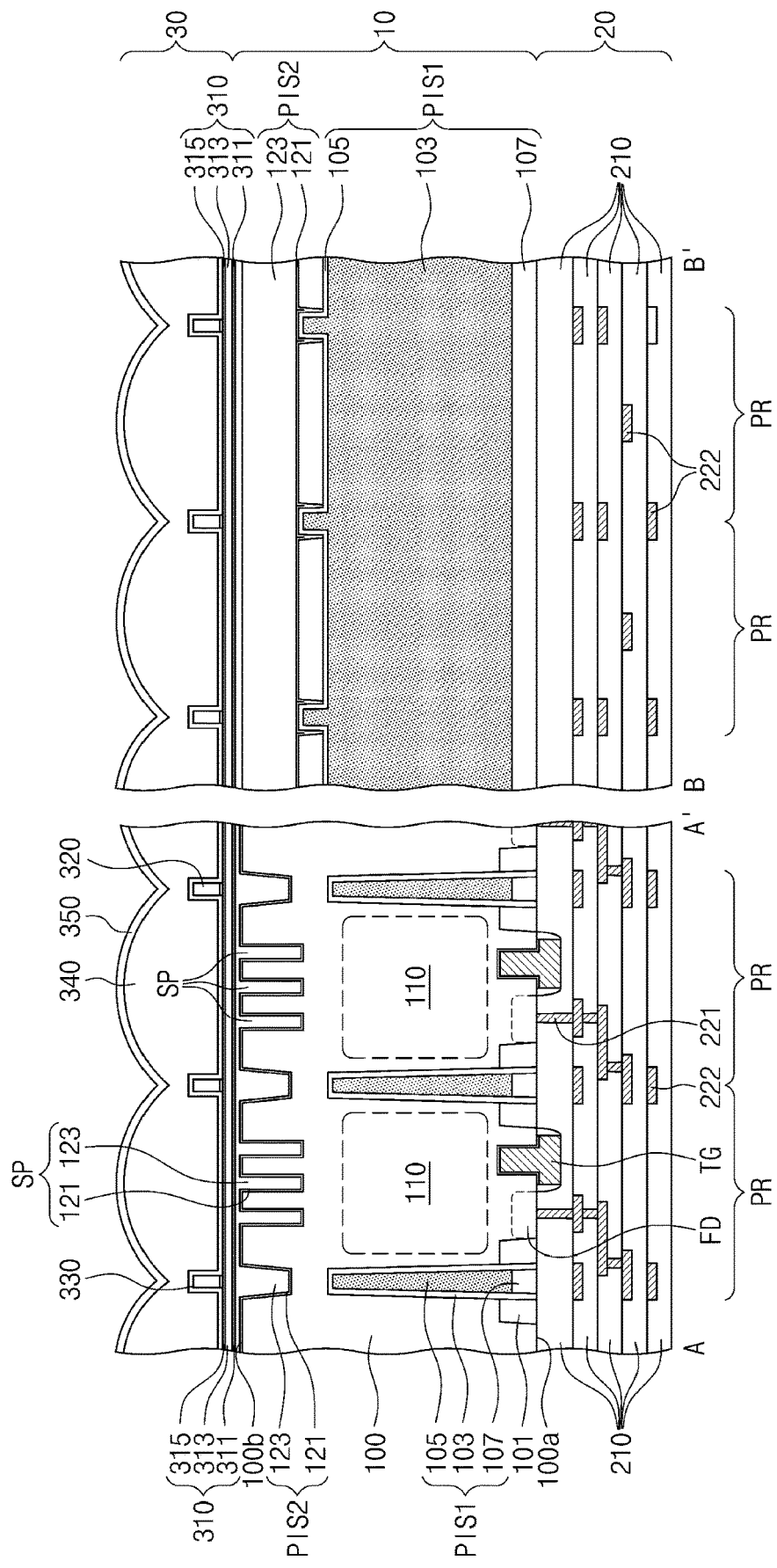
Figure 3D:
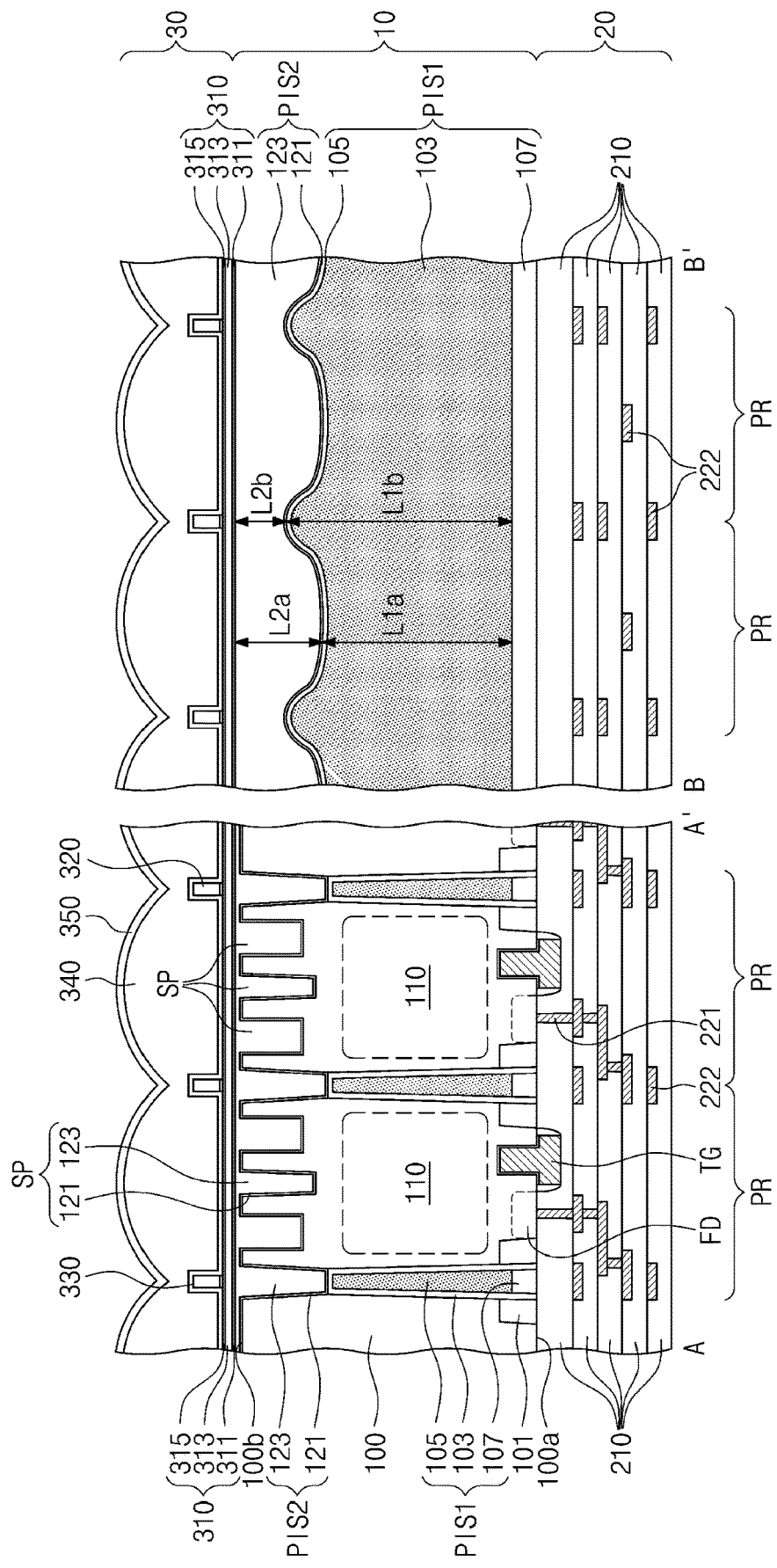
FIG. 3D illustrates a cross-sectional view taken along lines A-A' and B-B' of FIG. 2B.

FIGS. 2A and 2B illustrate plan views partially showing an image sensor according to an exemplary embodiment of the present inventive concept. FIGS. 3A, 3B, and 3C illustrate cross-sectional views taken along lines A-A', B-B', and C-C' of FIG. 2A, showing an image sensor according to an exemplary embodiment of the present inventive concept. FIG. 3D illustrates a cross-sectional view taken along lines A-A' and B-B' of FIG. 2B. FIGS. 4A to 4F illustrate enlarged views showing section P of FIG. 3A.

Referring to FIGS. 2A and 3A, an image sensor according to an exemplary embodiment of the present inventive concept may include a photoelectric conversion layer 10, a readout circuit layer 20, and an optical transmission layer 30. When viewed in cross-section, the photoelectric conversion layer 10 may be disposed between the readout circuit layer 20 and the optical transmission layer 30.

For example, a semiconductor substrate 100 may have a first surface (or, e.g., a front surface) 100*a* and a second surface (or, e.g., a rear surface) 100*b* that are opposite to each other. For example, the semiconductor substrate 100 may be an epitaxial layer formed on a bulk silicon substrate that has the same first conductivity type (e.g., p-type) as that of the epitaxial layer, or a p-type epitaxial layer from which a bulk silicon substrate is removed in fabrication of the image sensor. In addition, the semiconductor substrate 100 may be a bulk semiconductor substrate that includes a well of the first conductivity type.

On each of pixel regions PR, a device isolation layer 101 may be disposed adjacent to the first surface 100*a* of the semiconductor substrate 100. The device isolation layer 101 may form an active section on the semiconductor substrate 100.

The semiconductor substrate 100 may be provided therein with a first pixel separation structure PIS1 adjacent to the first surface 100*a* of the semiconductor substrate 100. The first pixel separation structure PIS1 may have a bottom surface between the first and second surfaces 100*a* and 100*b* of the semiconductor substrate 100. The first pixel separation structure PISA may be spaced apart from the second surface 100*b* of the semiconductor substrate 100. The first pixel separation structure PIS1 may have a first width at the first surface 100a of the semiconductor substrate 100 and a second width at the bottom surface of the first pixel separation structure PIS1. For example, the second width may be closer to the second surface 100b of the semiconductor substrate 100 than the first width. For example, the first width may be an upper width, and the second width may be a lower width. The second width may be substantially the same as or less than the first width. The first pixel separation structure PIS1 may have a width that gradually decreases from the first surface 100a toward the second surface 100b of the semiconductor substrate 100. For example, the first pixel separation structure PIS1 may have a tapered shape.

The first pixel separation structure PIS1 may have a first length L1 in a direction perpendicular to a surface of the semiconductor substrate 100. The first length L1 of the first pixel separation structure PIS1 may range from about 4 µm to about 8 µm.

The first pixel separation structure PIS1 may provide the pixel regions PR. The first pixel separation structure PIS1 may include first parts that are parallel to each other and extend along a first direction D1, second parts that are parallel to each other and run in a second direction D2 across the first parts, and intersection parts where the first and second parts intersect each other.

When viewed in a plan view, the first pixel separation structure PIS1 may surround each of the pixel regions PR. The first pixel separation structure PIS1 may separate the pixel regions PR from each other in the first and second directions D1 and D2, and this may also be applied to a second pixel separation structure PIS2 which will be discussed below. For example, the pixel regions PR may be two-dimensionally arranged along the first and second directions D1 and D2.

The first pixel separation structure PIS1 may include a liner dielectric pattern 103, a semiconductor pattern 105, and a capping pattern 107. The semiconductor pattern 105 may vertically penetrate a portion of the semiconductor substrate 100, and the liner dielectric pattern 103 may be provided between the semiconductor pattern 105 and the semiconductor substrate 100. The capping pattern 107 may be disposed on the semiconductor pattern 105, and may be, for example, a top surface at a level substantially the same as that of a top surface of the device isolation layer 101. The capping pattern 107 may have a bottom surface at a level the same as or lower than that of a bottom surface of the device isolation layer 101. However, the present inventive concept is not limited thereto, and for example, the bottom surface of the capping pattern 107 may be higher than the bottom surface of the device isolation layer 101. For example, the capping pattern 107 may have a round shape at the bottom surface thereof. The liner dielectric pattern 103 and the capping pattern 107 may include at least one of a silicon oxide layer, a silicon oxynitride layer, and/or a silicon nitride layer. The semiconductor pattern 105 may include an undoped polysilicon layer or an impurity-doped polysilicon layer. For example, the semiconductor pattern 105 may include an air gap or a void.

The semiconductor substrate 100 may be provided therein with a second pixel separation structure PIS2 adjacent to the second surface 100b of the semiconductor substrate 100. The second pixel separation structure PIS2 may have a bottom surface between the first and second surfaces 100a and 100b of the semiconductor substrate 100. For example, the second pixel separation structure PIS2 may be spaced apart from the first surface 100a of the semiconductor substrate 100. For example, the second pixel separation structure PIS2 may be disposed on the first pixel separation structure PIS1. For example, the second pixel separation structure PIS2 may be in contact with the first pixel separation structure PIS1.

The second pixel separation structure PIS2 may have a third width at the second surface 100b of the semiconductor substrate 100 and a fourth width at the bottom surface of the second pixel separation structure PIS2. For example, the third width may be an upper width, and the fourth width may be a lower width. The fourth width may be substantially the same as or less than the third width. The second pixel separation structure PIS2 may have a width that gradually decreases from the second surface 100b toward the first surface 100a of the semiconductor substrate 100.

The second pixel separation structure PIS2 may have a planar structure substantially the same as that of the first pixel separation structure PIS1. When viewed from a plan view, the second pixel separation structure PIS2 may overlap the first pixel separation structure PIS1. The second pixel separation structure PIS2 may include first parts P1 that are parallel to each other and extend along the first direction D1, second parts P2 that extend along the second direction D2 intersecting the first direction D1, and intersection parts P3 connected to the first and second parts P1 and P2. For example, the second pixel separation structure PIS2 may have a vertical length that is substantially the same at the first, second, and intersection parts P1, P2, and P3. For example, the second pixel separation structure PIS2 may have a height that is substantially consistent for the first, second, and intersection parts P1, P2, and P3.

The second pixel separation structure PIS2 may have a second length L2 in a vertical direction, and the second length L2 may be different from the first length L1 of the first pixel separation structure PIS1. However, the present inventive concept is not limited thereto. For example, the second length. L2 of the second pixel separation structure PIS2 may be substantially the same as the first length L1 of the first pixel separation structure PIS1. For example, the second length L2 of the second pixel separation structure PIS2 may range from about 2 µm to about 5 µm.

In an exemplary embodiment of the present inventive concept, a value of about 8 µm to about 13 µm may be given as a vertical thickness of the semiconductor substrate 100, or a sum of the first and second lengths L1 and L2 of the first and second pixel separation structures PIS1 and PIS2.

The second pixel separation structure PIS2 may be formed of at least one high-k dielectric layer whose dielectric constant is greater than that of a silicon oxide layer. For example, the second pixel separation structure PIS2 may include a surface dielectric layer 121 and a gap-fill dielectric layer 123.

In an exemplary embodiment of the present inventive concept, the semiconductor substrate 100 may have a first trench overlapping the first pixel separation structure PIS1 and disposed on the second surface 100b, and may also have a second trench that overlaps a photoelectric conversion region 110. The surface dielectric layer 121 may conformally cover inner walls of the first and second trenches and the second surface 100b of the semiconductor substrate 100. The gap-fill dielectric layer 123 may fill the first and second trenches in which the surface dielectric layer 121 is formed, and may have a top surface that is substantially flat. The surface and gap-fill dielectric layers 121 and 123 may include one of metal oxide and metal fluoride each of which includes at least one of hafnium (Hf), zirconium (Zr), aluminum (Al), tantalum (Ta), titanium (Ti), yttrium (Y), and/or lanthanoid (Ln). For example, the surface dielectric layer 121 may include an aluminum oxide layer, and the gap-fill dielectric layer 123 may include a hafnium oxide layer.

In an exemplary embodiment of the present inventive concept, the gap-fill dielectric layer 123 of the second pixel separation structure PIS2 may have a width less than that of the first pixel separation structure PIS1.

Figure 4A:
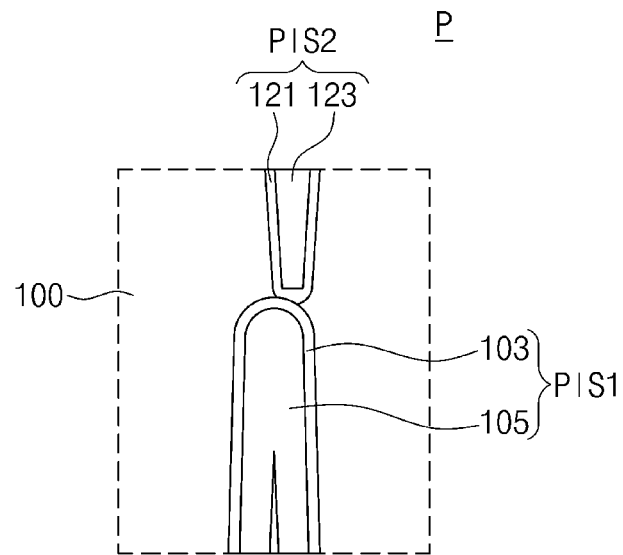
FIGS. 4A, 4B, 4C, 4D, 4E, and 4F' illustrate enlarged views showing section P of FIG. 3A.

Referring to FIG. 4A, the surface dielectric layer 121 of the second pixel separation structure PIS2 may be in contact with the liner dielectric pattern 103 of the first pixel separation structure PIS1.

Figure 4B:
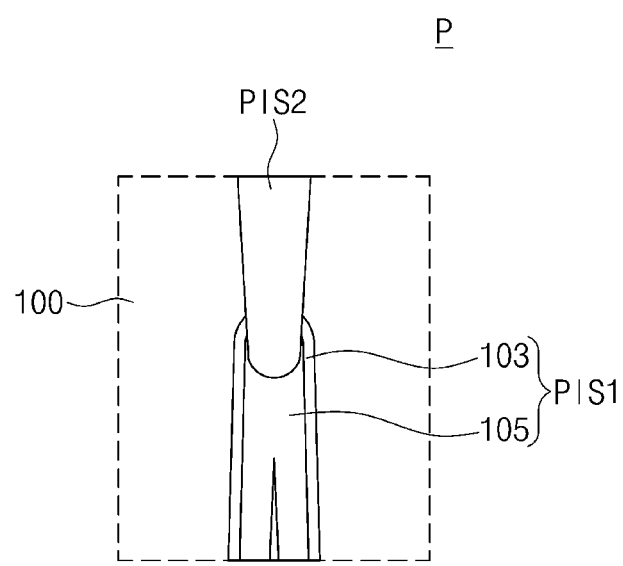

Referring to FIG. 4B, the surface dielectric layer 121 of the second pixel separation structure PIS2 may be in contact with the semiconductor pattern 105 of the first pixel separation structure PIS1. In an exemplary embodiment of the present inventive concept, the gap-fill dielectric layer 123 of the second pixel separation structure PIS2 may be in contact with the semiconductor pattern 105 of the first pixel separation structure PIS1.

Figure 4C:
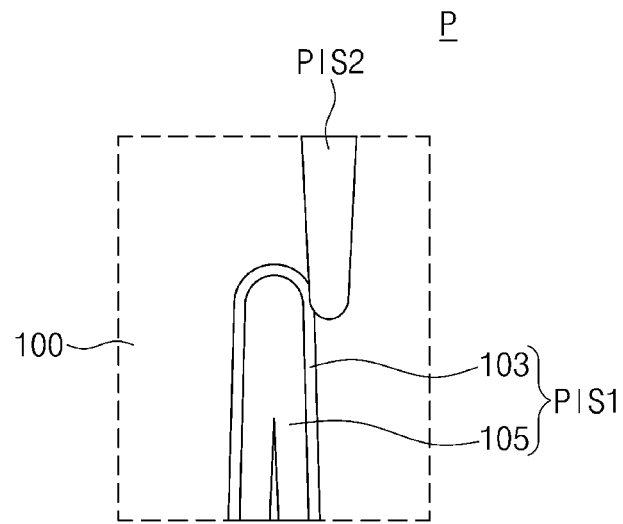

Referring to FIG. 4C, the second pixel separation structure PIS2 may be disposed to deviate from the first pixel separation structure PIS1. In this case, the second pixel separation structure PIS2 may be in partial contact with a sidewall of the first pixel separation structure PIS1. For example, the second pixel separation structure PIS2 may be misaligned with the first pixel separation structure PIS1.

Figure 4D:
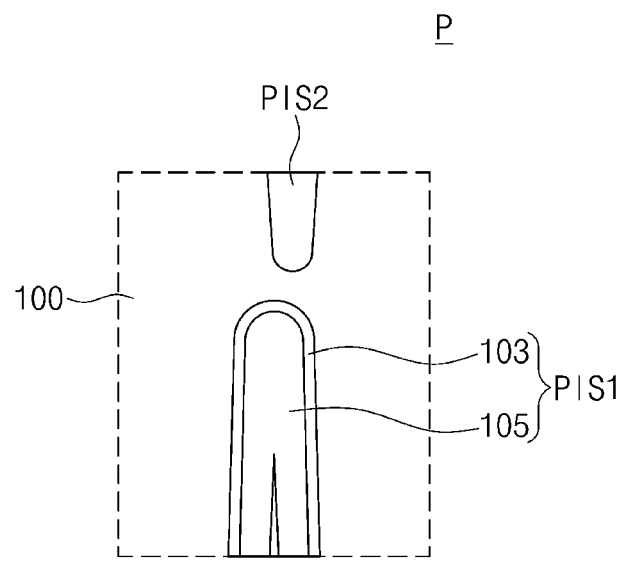

Referring to FIG. 4D, the second pixel separation structure PIS2 may be vertically spaced apart from the first pixel separation structure PIS1, while overlapping the first pixel separation structure PIS1. For example, a portion of the semiconductor substrate 100 may be present between the first pixel separation structure PIS1 and the second pixel separation structure PIS2.

Figure 4E:
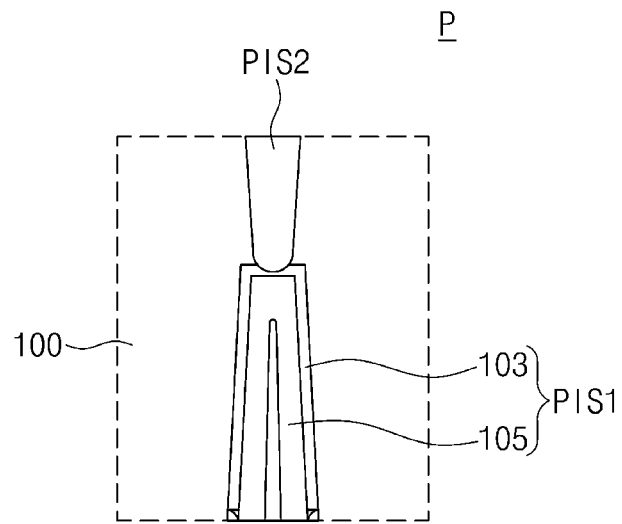

Referring to FIG. 4E, the first pixel separation structure PIS1 may have a flat bottom surface. For example, the liner dielectric pattern 103 of the first pixel separation structure PIS1 may include a flat bottom part and sidewall parts that vertically extend from the bottom part. The second pixel separation structure PIS2 may be in contact with the flat bottom surface of the first pixel separation structure PIS1.

Figure 4F:
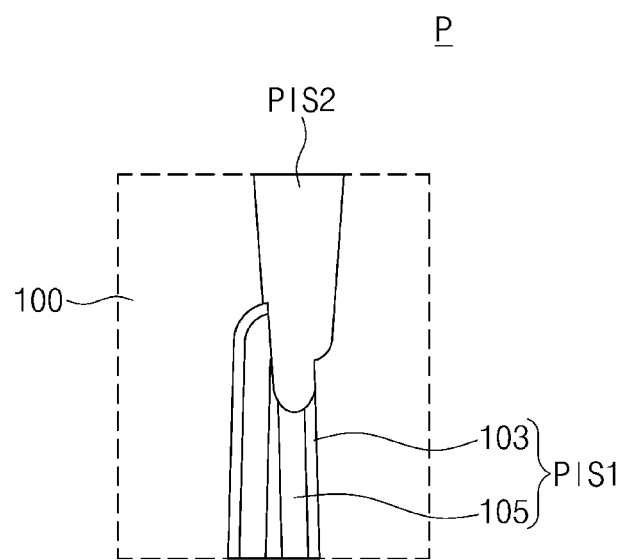

Referring to FIG. 4F, the second pixel separation structure PIS2 may partially penetrate the first pixel separation structure PIS1. The second pixel separation structure PIS2 may include a first portion (e.g., an upper portion) that penetrates the semiconductor substrate 100 and a second portion (e.g., a lower portion) that penetrates the first pixel separation structure PIS1. For example, the lower portion may have a width less than that of the upper portion.

Referring back to FIGS. 2A and 3A, a plurality of photoelectric conversion regions 110 may be provided in the semiconductor substrate 100 of their corresponding pixel regions PR. The photoelectric conversion regions 110 may generate photo-charges in proportion to a magnitude of incident light. The photoelectric conversion regions 110 may be formed in the semiconductor substrate 100 by implanting the semiconductor substrate 100 with impurities having a second conductivity type opposite to that of the semiconductor substrate 100. A photodiode may be formed at a junction between the semiconductor substrate 100 having the first conductivity type and the photoelectric conversion region 110 having the second conductivity type.

According to an exemplary embodiment of the present inventive concept, the photoelectric conversion regions 110 may each have a difference in impurity concentration between a location thereof adjacent to the first surface 100a and a location thereof adjacent to the second surface 100b, and thus a potential gradient may be provided between the first and second surfaces 100a and 100b of the semiconductor substrate 100. For example, each of the photoelectric conversion regions 110 may include a plurality of vertically stacked impurity regions.

According to an exemplary embodiment of the present inventive concept, on each of the pixel regions PR, scattering patterns SP may be provided on the second surface 100b of the semiconductor substrate 100. The scattering patterns SP may be disposed in a plurality of second trenches formed on the second surface 100b of the semiconductor substrate 100. The scattering patterns SP may have substantially uniform widths and may be spaced apart from each other at a regular interval. However, the present inventive concept is not limited thereto. For example, the scattering patterns SP may not be spaced apart from each other at a regular interval.

The scattering patterns SP may have their top surfaces at a level substantially the same as that of a top surface of the second pixel separation structure PIS2. For example, the top surfaces of the scattering patterns SP may be substantially coplanar with the top surface of the second separation structure PIS2.

The scattering patterns SP may be formed of the same material as that of the second pixel separation structure PIS2, and may have the same stacking structure as that of the second pixel separation structure PIS2. For example, the scattering patterns SP may be formed of a high-k dielectric layer whose dielectric constant is greater than that of a silicon oxide layer. The scattering patterns SP may include a surface dielectric layer 121 and a gap-fill dielectric layer 123.

Portions of the surface and gap-fill dielectric layers 121 and 123, included in the second pixel separation structure PIS2 and the scattering patterns SP, may be disposed on the second surface 100b of the semiconductor substrate 100. For example, the surface dielectric layer 121 may directly contact the semiconductor substrate 100, and the gap-fill dielectric layer 123 may have a flat top surface.

As shown in FIG. 2A, the scattering patterns SP may be shaped like circles, tetragons, or polygons, from a plan view. The scattering patterns SP may be spaced apart from each other in the first and second directions D1 and D2. For example, the scattering patterns SP may be arranged in a matrix shape, a checkerboard shape, or any other suitable shape.

The scattering patterns SP may each have a third length L3 in a vertical direction, and the third length L3 of the scattering patterns SP may be different from the second length L2 of the second pixel separation structure PIS2. For example, as illustrated in FIG. 3A, the third length L3 of the scattering patterns SP may be less than the second length L2 of the second pixel separation structure PIS2. As another example, referring to FIG. 3B, the third length L3 of the scattering patterns SP may be substantially the same as the second length L2 of the second pixel separation structure PIS2. In another example, referring to FIG. 3C, the third length L3 of the scattering patterns SP may be greater than the second length L2 of the second pixel separation structure PIS2. In another example, referring to FIG. 3D, the scattering patterns SP may have varying lengths, and each of the lengths may be less than the second length L2.

The scattering patterns SP may scatter incident light having a relatively long wavelength and may allow the incident light to have an increased optical path. Therefore, the photoelectric conversion regions 110 may have an increase in optical absorption efficiency of incident light.

The readout circuit layer 20 may be disposed on the first surface 100a of the semiconductor substrate 100. The readout circuit layer 20 may include readout circuits connected to the photoelectric conversion layer 10. The readout circuit layer 20 may signally process an electrical signal converted in the photoelectric conversion layer 10.

For example, the readout circuits may include MOS transistors (e.g., a reset transistor, a source follower transistor, and a selection transistor). On the pixel regions PR, transfer gate electrodes TG may be disposed on the first surface 100a of the semiconductor substrate 100. When viewed from a plan view, the transfer gate electrode TG may be positioned in each pixel region PR. For example, the transfer gate electrode TF may be positioned on a central portion of each pixel region PR. A portion of the transfer gate electrode TG may be disposed in the semiconductor substrate 100, and a gate dielectric layer may be interposed between the transfer gate electrode TG and the semiconductor substrate 100. A floating diffusion region FD may be provided in the semiconductor substrate 100 on one side of the transfer gate electrode 1G. The floating diffusion region FD may be formed by implanting the semiconductor substrate 100 with impurities whose conductivity type is opposite to that of semiconductor substrate 100. For example, the floating diffusion region FD may be an n-type impurity region.

Interlayer dielectric layers 210 may be stacked on the first surface 100a of the semiconductor substrate 100, and may cover the transfer gate electrode TG and the MOS transistors included in the readout circuits. The interlayer dielectric layers 210 may include, for example, one or more of silicon oxide, silicon nitride, and/or silicon oxynitride.

The interlayer dielectric layers 210 may have therein wiring structures 221 and 222 connected to the readout circuits. The wiring structures 221 and 222 may include metal lines 222 and contact plugs 221 that connect the metal lines 222 to each other.

The optical transmission layer 30 may be disposed on the second surface 100b of the semiconductor substrate 100. The optical transmission layer 30 may include a planarized dielectric layer 310, a grid structure 320, a protection layer 330, a microlens array 340, and a passivation layer 350.

For example, the planarized dielectric layer 310 may be disposed on the gap-fill dielectric layer 123 of the scattering patterns SP and the second pixel separation structure PIS2. The planarized dielectric layer 310 may include a first planarized layer 311, a second planarized layer 313, and a third planarized layer 315 that are sequentially stacked on the gap-fill dielectric layer 123. The first, second, and third planarized layers 311, 313, and 315 may be formed of a transparent dielectric material. The first, second, and third planarized layers 311, 313, and 315 may have refractive indices that are different from each other. The first, second, and third planarized layers 311, 313, and 315 may be combined to have a predetermined thickness and to have a relatively high refractive index. For example, the second planarized layer 313 may be thicker than the first planarized layer 311 and/or the third planarized layer 315.

The first and the third planarized layers 311 and 315 may have the same refractive index as each other, and the second planarized layer 313 may have a different refractive index from that of the first and third planarized layers 311 and 315. For example, the first and third planarized layers 311 and 315 may include metal oxide, and the second planarized layer 313 may include silicon oxide.

The grid structure 320 may be disposed on the planarized dielectric layer 310. Similar to that of the first and second pixel separation structures PIS1 and PIS2, the grid structure 320 may have a grid shape when viewed from a plan view.

When viewed from a plan view, the grid structure 320 may overlap the first and second pixel separation structures PIS1 and PIS2. For example, the grid structure 320 may include first parts that extend in the first direction D1, and may also include second parts that extend in the second direction D2 while running across the first parts. The grid structure 320 may have a width substantially the same as or less than minimum widths of the first and second pixel separation structures PIS1 and PIS2.

The grid structure 320 may include one or more of a light-shielding pattern and a low-refractive pattern. The light-shielding pattern may include a metallic material, such as titanium, tantalum, or tungsten. The low-refractive pattern may be formed of a material whose refractive index is less than that of the light-shielding pattern. The low-refractive pattern may be formed of an organic material and may have a refractive index of about 1.1 to about 1.3. For example, the grid structure 320 may be a polymer layer including silica nano-particles.

The planarized dielectric layer 310 may be provided on second surface 100b of the semiconductor substrate with the protection layer 330 having a substantially uniform thickness that covers a surface of the grid structure 320. The protection layer 330 may be a single layer or multiple layers including one or more of, for example, aluminum oxide and silicon carbon oxide.

The microlens array 340 may be disposed on the protection layer 330. The microlens array 340 may include a planarized part that fills a space provided by the grid structure 320, and may also include microlenses that are provided on the planarized part and correspond to the pixel regions PR.

The passivation layer 350 may conformally cover a top surface of the microlens array 340. The passivation layer 350 may be formed of, for example, inorganic oxide.

The following will discuss an image sensor according to an exemplary embodiment of the present inventive concept, and explanations of the same features as those of the image sensor discussed above may be omitted for brevity of description.

Referring to FIGS. 2A and 3B, as discussed above, the first pixel separation structure PIS1 may overlap the second pixel separation structure PIS2. Each of the first and second pixel separation structures PIS1 and PIS2 may include first parts P1 that extend in the first direction D1, second parts P2 that extend in the second direction D2 intersecting the first direction D1, and interconnection parts P3 connected to the first and second parts P1 and P2.

The first pixel separation structure PIS1 may have a first length L1a in a vertical direction at the first and second parts P1 and P2, and may also have at the intersection parts P3 a second length L1b, in the vertical direction, greater than the first length L1a. In an exemplary embodiment of the present inventive concept, the first pixel separation structure PIS1 may have a round profile on a surface (e.g., a bottom surface) thereof. The first pixel separation structure PIS1 may have a minimum vertical length at centers of the first and second parts P1 and P2, and may also have a maximum vertical length at the intersection parts P3. For example, the first and second parts P1 and P2 of the first pixel separation structure PIS1 may have vertical lengths that increase as approaching the intersection parts P3 from the centers thereof.

The second pixel separation structure PIS2 may be in contact with the first pixel separation structure PIS1. For example, the second pixel separation structure PIS2 may be in contact with an entirety of the first pixel separation structure PIS1. The second pixel separation structure PIS2 may have a third length L2a in a vertical direction at the first and second parts P1 and P2, and may also have at the intersection parts P3 a fourth length L2b in the vertical direction less than the third length L2a. The second pixel separation structure PIS2 may have undulation on a surface adjacent to the first pixel separation structure PIS1.

Referring to FIGS. 2A and 3C, as discussed above, the first pixel separation structure PIS1 may be vertically spaced apart from the second pixel separation structure PIS2, while overlapping the second pixel separation structure PIS2.

For example, the first and second parts P1 and P2 of the first pixel separation structure PIS1 may be vertically spaced apart from the first and second parts P1 and P2 of the second pixel separation structure PIS2. Because, as discussed above, the intersection parts P3 of the first pixel separation structure PIS1 have lengths greater than those of the first and second parts P1 and P2 of the first pixel separation structure PIS1, the intersection parts P3 of the first pixel separation structure PIS1 may be in contact with the second pixel separation structure PIS2.

Figure 5:
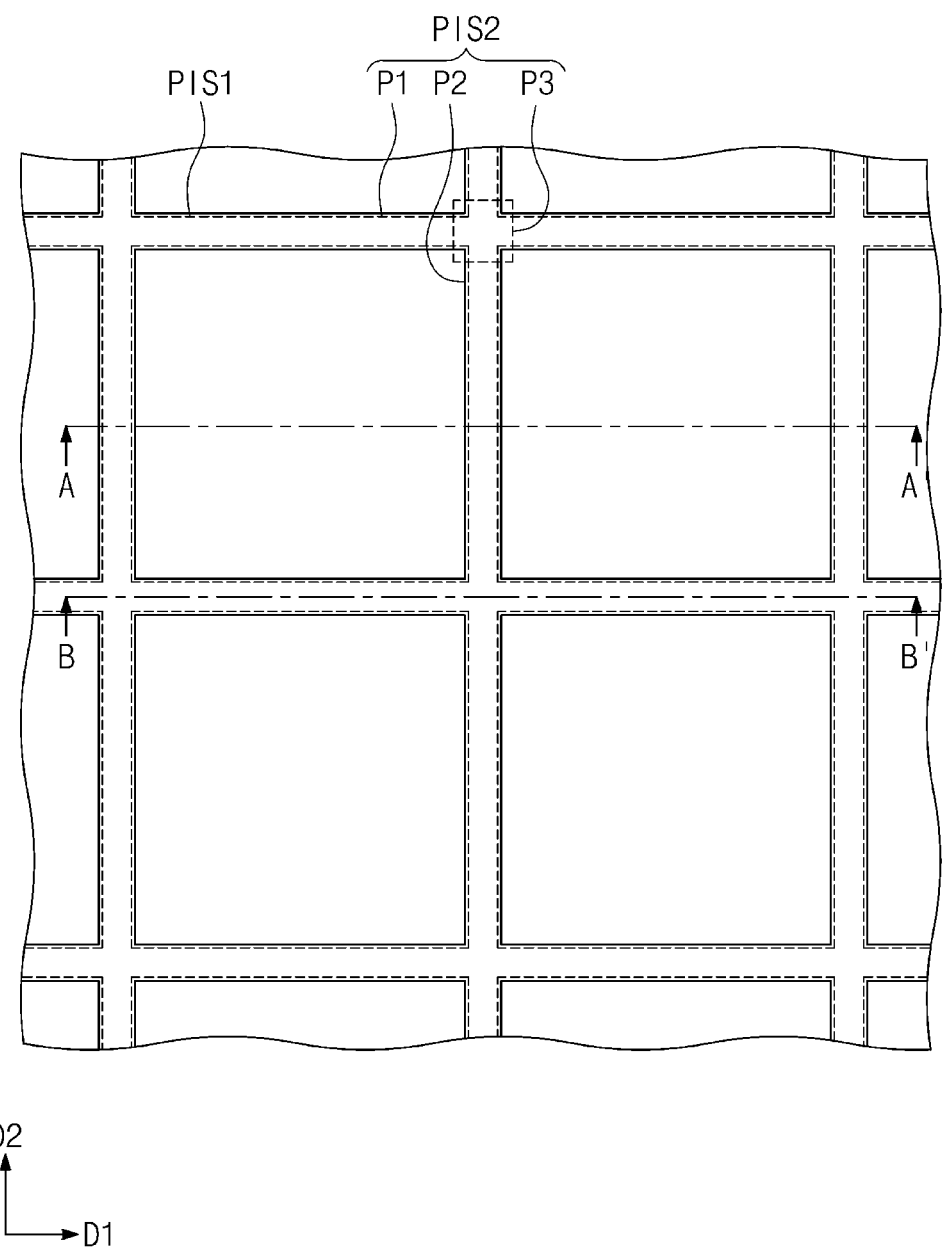
FIG. 5 illustrates a plan view partially showing an image sensor according to an exemplary embodiment of the present inventive concept.
Figure 6:
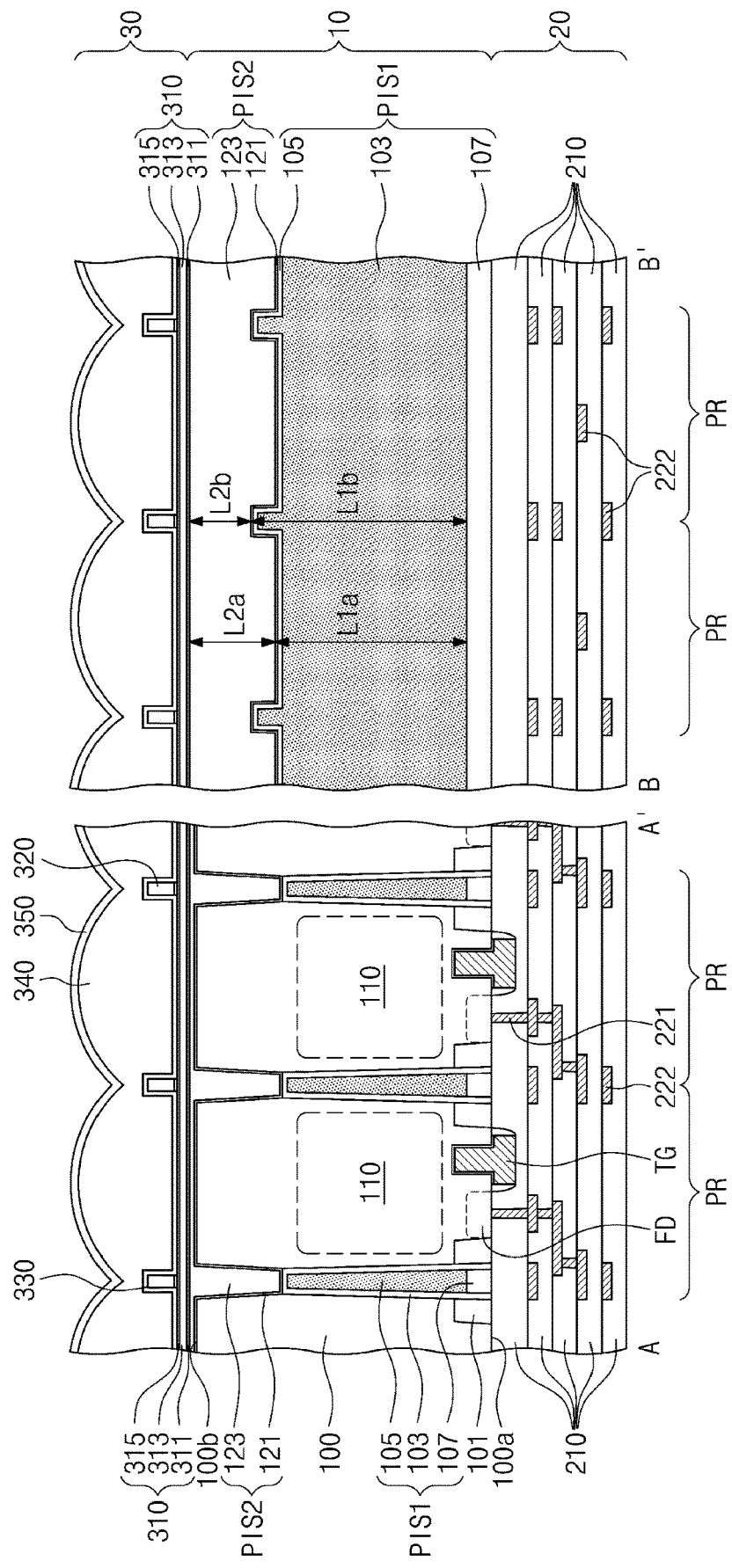
FIG. 6 illustrates a cross-sectional view taken along lines A-A' and B-B' of FIG. 5, showing an image sensor according to an exemplary embodiment of the present inventive concept.

Referring to FIGS. 2B and 3D, the scattering patterns SP may include bar-shaped or polygonally shaped (e.g., rectangular) patterns, and the bar-shaped or polygonally shaped patterns may be disposed in all directions when viewed from a plan view. Some of the bar-shaped or polygonally shaped patterns may intersect each other, and may have at an intersection part vertical lengths greater than those of other parts, FIG. 5 illustrates a plan view partially showing an image sensor according to an exemplary embodiment of the present inventive concept. FIG. 6 illustrates a cross-sectional view taken along lines A-A' and B-B' of FIG. 5, showing an image sensor according to an exemplary embodiment of the present inventive concept.

Referring to FIGS. 5 and 6, the scattering patterns SP may be omitted from each pixel region PR. For example, on each pixel region PR, the semiconductor substrate 100 may have a substantially flat surface on the second surface 100b.

In an exemplary embodiment of the present inventive concept, because the first and second pixel separation structures PIS1 and PIS2 are formed in the semiconductor substrate 100, the semiconductor substrate 100 may have an increased thickness. Therefore, even though the scattering patterns SP are omitted from each pixel region PR, it may be possible to secure optical absorption efficiency of incident light having a long wavelength.

Figure 7:
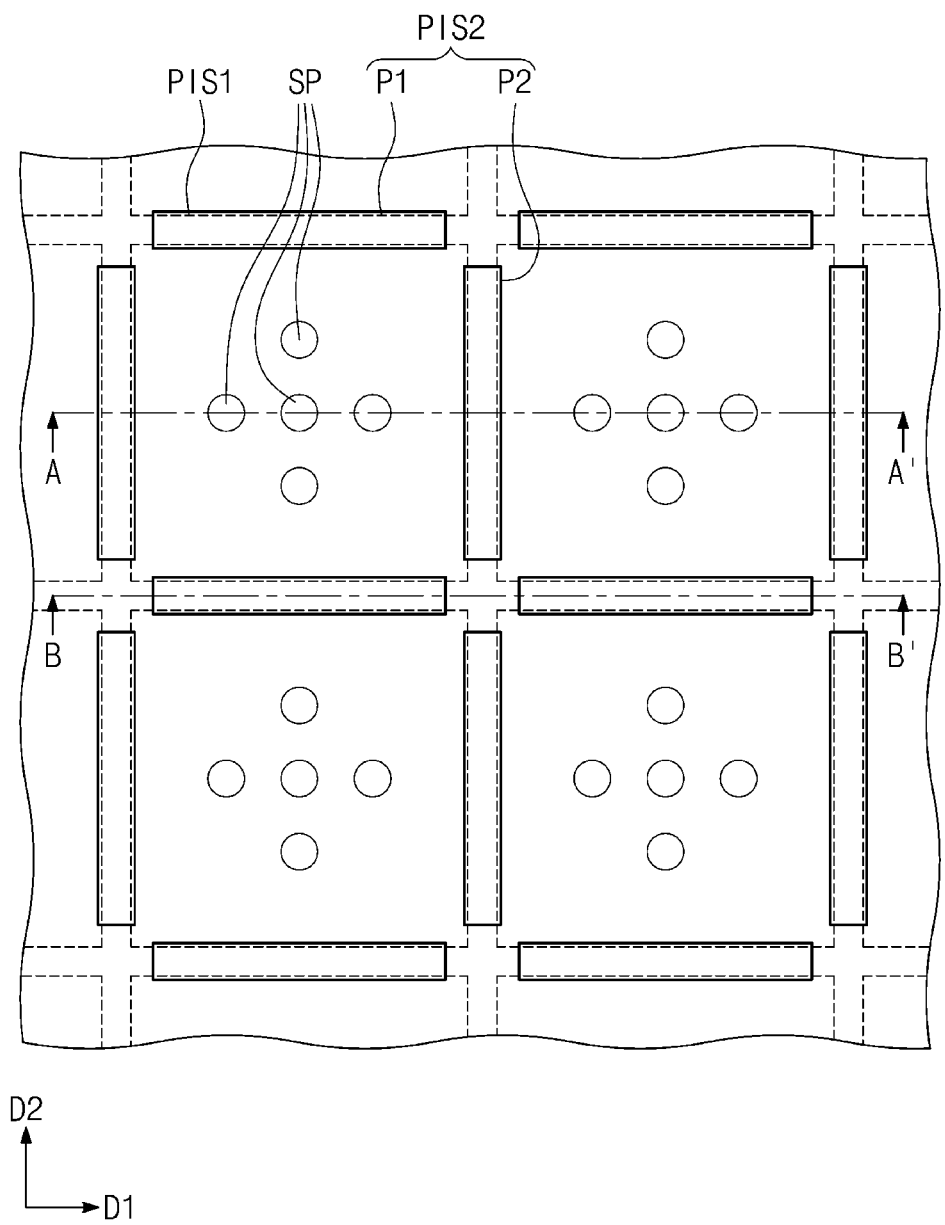
FIG. 7 illustrates a plan view partially showing an image sensor according to an exemplary embodiment of the present inventive concept.
Figure 8:
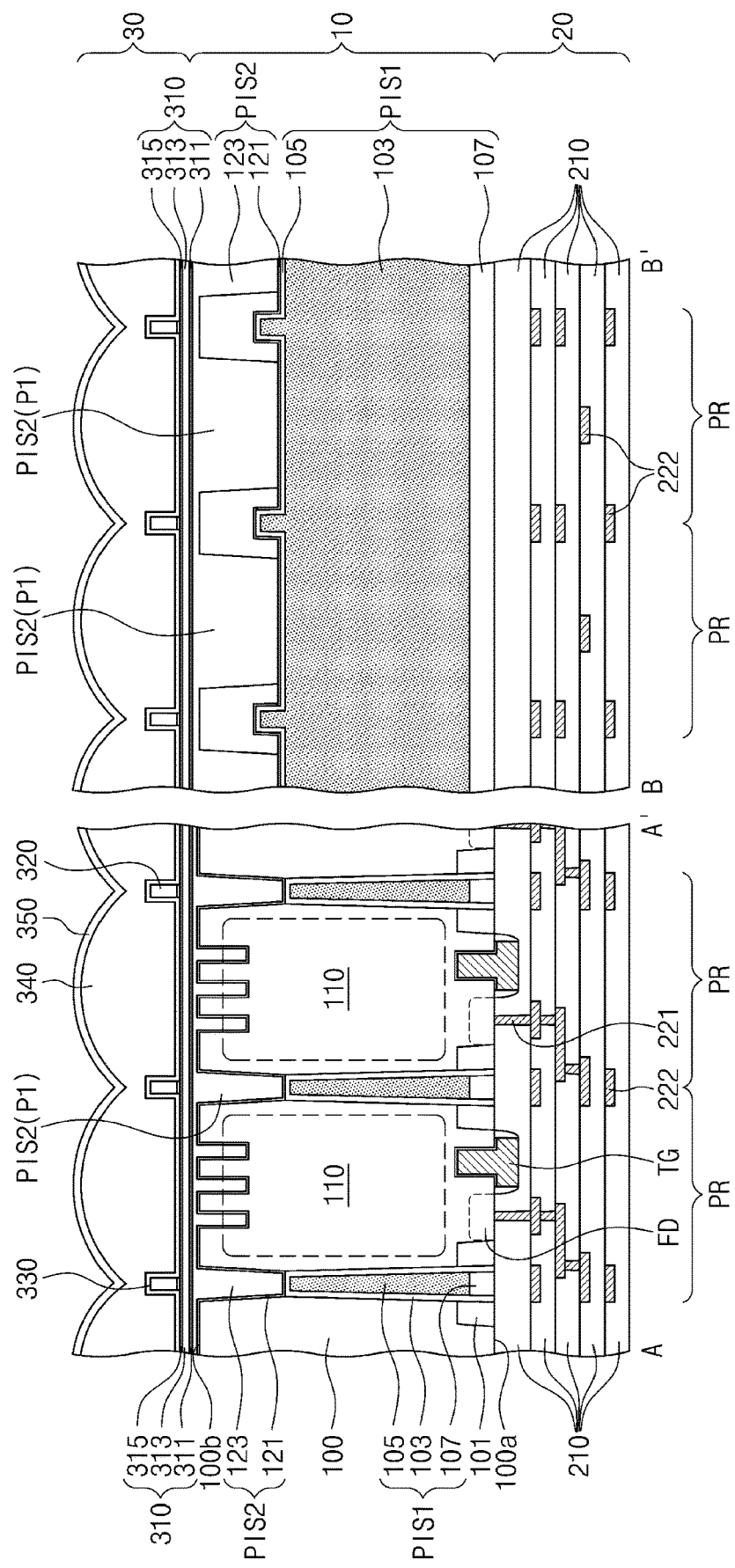
FIG. 8 illustrates a cross-sectional view taken along lines A-A' and B-B' of FIG. 7, showing an image sensor according to an exemplary embodiment of the present inventive concept.

FIG. 7 illustrates a plan view partially showing an image sensor according to an exemplary embodiment of the present inventive concept. FIG. 8 illustrates a cross-sectional view taken along lines A-A' and B-B' of FIG. 7, showing an image sensor according to an exemplary embodiment of the present inventive concept.

Referring to FIGS. 7 and 8, as discussed above, the first pixel separation structure PIS1 may include first parts that extend in the first direction D1, second parts that extend in the second direction D2, and intersection parts connected to the first and second parts.

The second pixel separation structure PIS2 may include first parts P1 that extend in the first direction D1 and second parts P2 that extend in the second direction D2, and the first parts P1 may be spaced apart from the second parts P2.

For example, the first and second parts of the first pixel separation structure PIS1 may overlap and contact the first and second parts P1 and P2, respectively, of the second pixel separation structure PIS2. The intersection parts of the first pixel separation structure PIS1 may be spaced apart from the second pixel separation structure PIS2, and may be in contact with the semiconductor substrate 100.

Figure 9:
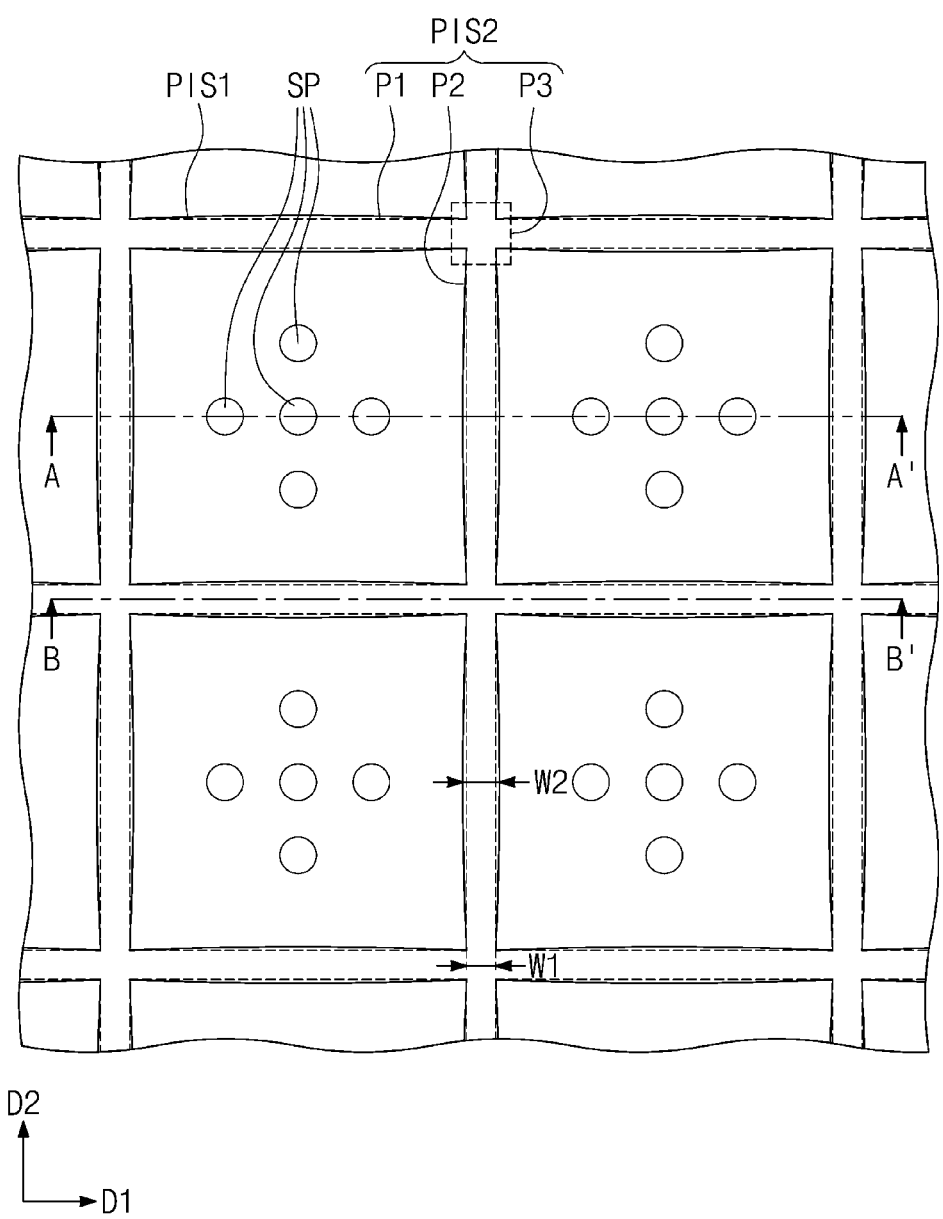
FIG. 9 illustrates a plan view partially showing an image sensor according to an exemplary embodiment of the present inventive concept.
Figure 10:
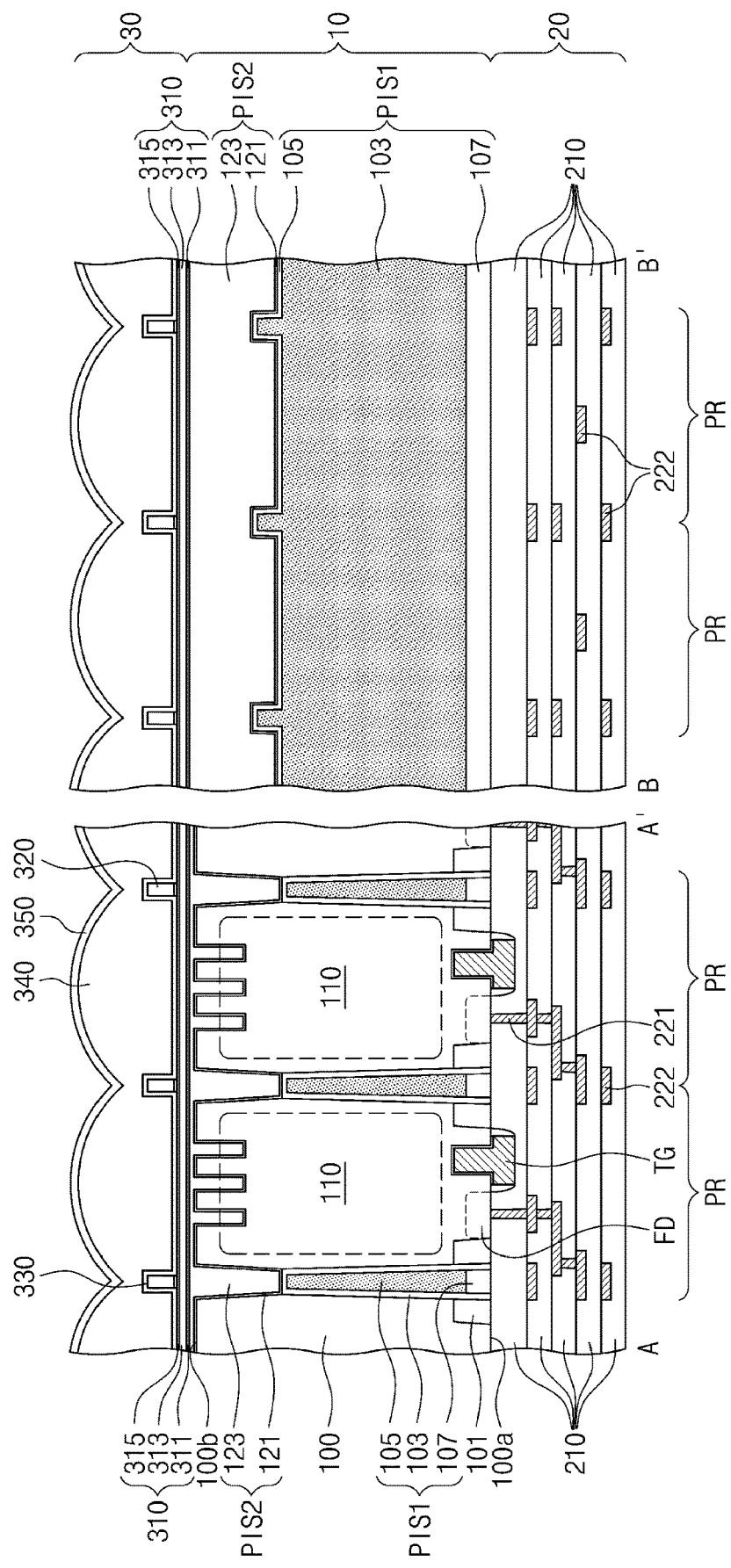
FIG. 10 illustrates a cross-sectional view taken along lines A-A' and B-B' of FIG. 9, showing an image sensor according to an exemplary embodiment of the present inventive concept.

FIG. 9 illustrates a plan view partially showing an image sensor according to an exemplary embodiment of the present inventive concept. FIG. 10 illustrates a cross-sectional view taken along lines A-A' and B-B' of FIG. 9, showing an image sensor according to an exemplary embodiment of the present inventive concept.

Referring to FIGS. 9 and 10, as discussed above, each of the first and second pixel separation structures PIS1 and PIS2 may include first parts P1 that extend in the first direction D1, second parts P2 that extend in the second direction D2 intersecting the first direction D1, and intersection parts P3 connected to the first and second parts P1 and P2.

The first and second parts of the first pixel separation structure PIS1 may have substantially the same width as each other. However, the present inventive concept is not limited thereto.

Each of the first parts P1 of the second pixel separation structure PIS2 may have a first width W1, which is at a first portion adjacent to the second parts P2, and a second width W2, which is greater than the first width W1, at a second portion spaced apart from the second parts P2. This may be applicable to the second parts of the second pixel separation structure PIS2. For example, each of the second parts P2 of the second pixel separation structure PIS2 may have a first width W1, which is at a first portion adjacent to the first parts P1, and a second width W2, which is greater than the first width W1, at a second portion spaced apart from the first parts P1. For example, the second pixel separation structure PIS2 may have a minimum width at the intersection parts P3 and a maximum width at the first and second parts P1 and P2, for example, at a central portion of the first and second parts P1 and P2. In addition, the widths of the first and second parts P1 and P2 may progressively increase as approaching a maximum-width position from a minimm-width position. In addition, the second pixel separation structure PIS2 may have at the first and second parts P1 and P2 lengths greater than those at the intersection parts P3. For example, the second width W2 at the second portion of the first and second parts P1 and P2 of the second pixel separation structure PIS2 may be greater than that of the first and second parts of the first pixel separation structure PIS1. As such, because the second pixel separation structure PIS2 has different widths at the first and second portions, the second pixel separation structure PIS2 may contact an entirety of the first pixel separation structure PIS1.

Figure 11A:
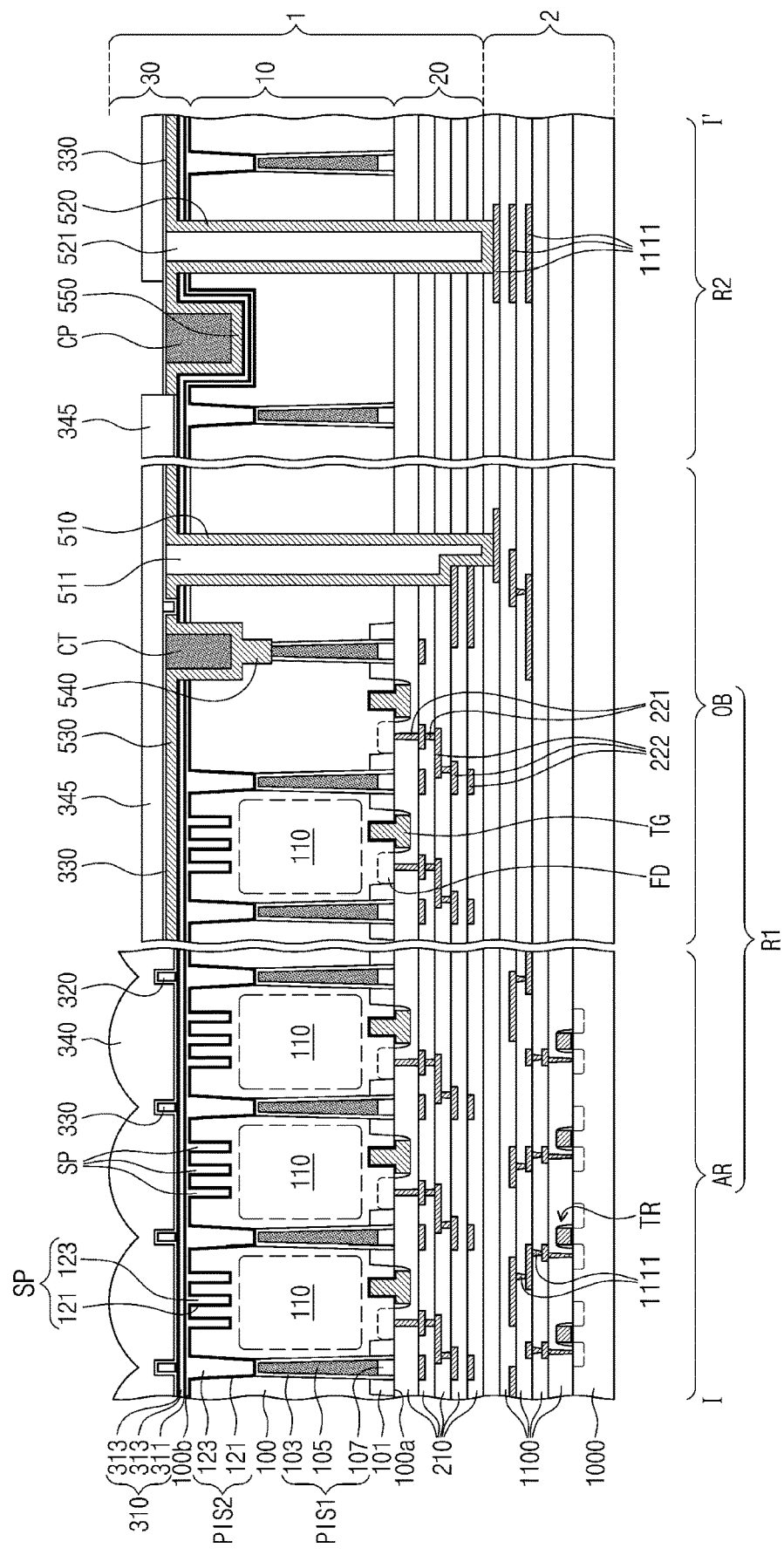
FIGS. 11A and 11B illustrate cross-sectional views taken along line A-A' of FIG. 1, showing an image sensor according to an exemplary embodiment of the present inventive concept.

FIG. 11A illustrates a cross-sectional view taken along line A-A' of FIG. 1, showing an image sensor according to an exemplary embodiment of the present inventive concept.

Referring to FIGS. 1 and 11A, an image sensor may include a sensor chip 1 and a logic chip 2.

The sensor chip 1, as discussed above, may include a photoelectric conversion layer 10, a readout circuit layer 20, and an optical transmission layer 30.

As mentioned above, the photoelectric conversion layer 10 of the sensor chip 1 may include a semiconductor substrate 100, first and second pixel separation structures PIS1 and PIS2 that provide pixel regions PR, and photoelectric conversion regions 110 provided in the pixel regions PR.

The semiconductor substrate 100 may include a light-receiving region AR, a light-shielding region OB, and a pad region R2. On the light-receiving region AR, the sensor chip 1 may have technical characteristics the same as those of the image sensor discussed above.

Figure 11B:
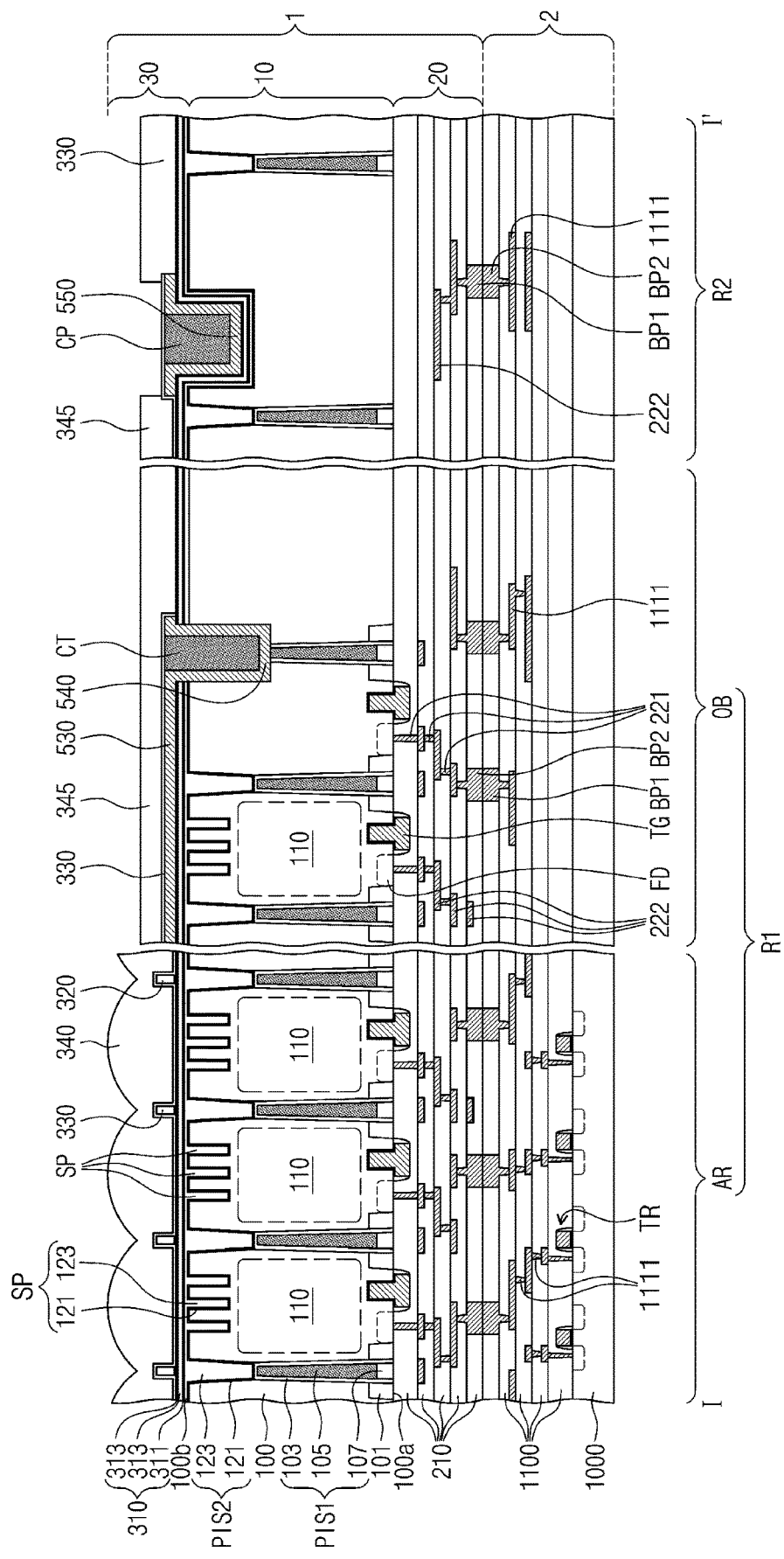

The first and second pixel separation structures PIS1 and PIS2 may be disposed in the semiconductor substrate 100 on the light-shielding region OB. A portion of the first pixel separation structure PIS1 may be connected to a contact plug 540 on the light-shielding region OB. A contact pad CT may be disposed on the contact plug 540, and the contact pad CT may be provided on a second surface 100b of the semiconductor substrate 100 on the light-shielding region OB. The contact pad CT may include aluminum. The contact plug 540 may penetrate a portion of the semiconductor substrate 100. As shown in FIG. 11A, the contact plug 540 may have a stepwise sidewall profile. For example, the contact plug 540 may have a first surface and a second surface lower than the first surface. In addition, as shown in FIG. 11B, the contact plug 540 may have a vertical or inclined sidewall.

A planarized dielectric layer 310 may extend from the light-receiving region AR toward the light-shielding region OB and the pad region R2. On the light-shielding region OB, a light-shielding pattern 530 may be disposed on the planarized dielectric layer 310. The light-shielding pattern 530 may block incidence of light on the photoelectric conversion regions 110 provided on the light-shielding region OB.

On the light-shielding region OB, a first through conductive pattern 510 may penetrate the semiconductor substrate 100 and may have electrical connection with a metal line 222 of the readout circuit layer 20 and with a wiring structure 1111 of the logic chip 2. The first through conductive pattern 510 may have a first bottom surface and a second bottom surface that are positioned at different levels. A first buried pattern 511 may be provided in the first through conductive pattern 510. The first buried pattern 511 may include a material whose refractive index is relatively low and may have dielectric characteristics.

On the pad region R2, conductive pads CP may be provided on the second surface 100b of the semiconductor substrate 100. The conductive pads CP may include metal, such as aluminum, copper, tungsten, titanium, tantalum, or any alloy thereof. A plurality of bonding wires may be bonded to the conductive pads CP in an image sensor mounting process. The conductive pads CP may be electrically connected through the bonding wires to an external device.

According to an exemplary embodiment of the present inventive concept, the first and second pixel separation structures PIS1 and PIS2 may be provided on the pad region R2 and may be disposed around the conductive pads CP.

On the pad region R2, a second through conductive pattern 520 may penetrate the semiconductor substrate 100 and may have electrical connection with the wiring structure 1111 of the logic chip 2. The second through conductive pattern 520 may extend on the second surface 100b of the semiconductor substrate 100 and may have electrical connection with the conductive pads CP. The second through conductive pattern 520 may have a portion 550 that covers, for example, bottom surfaces and sidewalls of the conductive pads CP. A second buried pattern 521 may be provided in the second through conductive pattern 520. The second buried pattern 521 may include a material whose refractive index is relatively low and may have dielectric characteristics.

The logic chip 2 may include a logic semiconductor substrate 1000, logic circuits TR, wiring structures 1111 connected to the logic circuits TR, and logic interlayer dielectric layers 1100. An uppermost one of the logic interlayer dielectric layers 1100 may be coupled to the readout circuit layer 20 of the sensor chip 1. The logic chip 2 may be electrically connected to the sensor chip 1 through the first through conductive pattern 510 and the second through conductive pattern 520.

FIG. 11B illustrates a cross-sectional view taken along line A-A' of FIG. 1, showing an image sensor according to an exemplary embodiment of the present inventive concept. The technical features the same as those of the image sensor discussed with reference to FIG. 11A will be omitted in the interest of brevity, and a difference thereof will be described below.

According to the embodiment illustrated in FIG. 11B, an image sensor may be configured such that the sensor chip 1 may include first bonding pads BP1 provided on an uppermost metal layer of the readout circuit layer 20, and that the logic chip 2 may include second bonding pads BP2 provided on an uppermost metal layer of the readout circuit layer 20 and on the wiring structure 1111. The first and second bonding pads BP1 and BP2 may include, for example, at least one of tungsten (W), aluminum (Al), copper (Cu), tungsten nitride (WN), tantalum nitride (TaN), and/or titanium nitride (TiN).

A hybrid bonding may be used to directly and electrically connect the first bonding pads BP1 of the sensor chip 1 to the second bonding pads BP2 of the logic chip 2. In this description, the term "hybrid bonding" may denote a bonding method in which two components of the same kind are merged at an interface therebetween. For example, when the first and second bonding pads BP1 and BP2 are formed of copper, a copper-to-copper bonding may be employed to physically and electrically connect the first and second bonding pads BP1 and BP2 to each other. In addition, a dielectric-to-dielectric bonding may be adopted to couple a surface of a dielectric layer included in the sensor chip 1 to a surface of a dielectric layer included in the logic chip 2.

FIGS. 12 to 17 illustrate cross-sectional views taken along line A-A' of FIG. 1, showing a method of fabricating an image sensor according to an exemplary embodiment of the present inventive concept.

Figure 12:
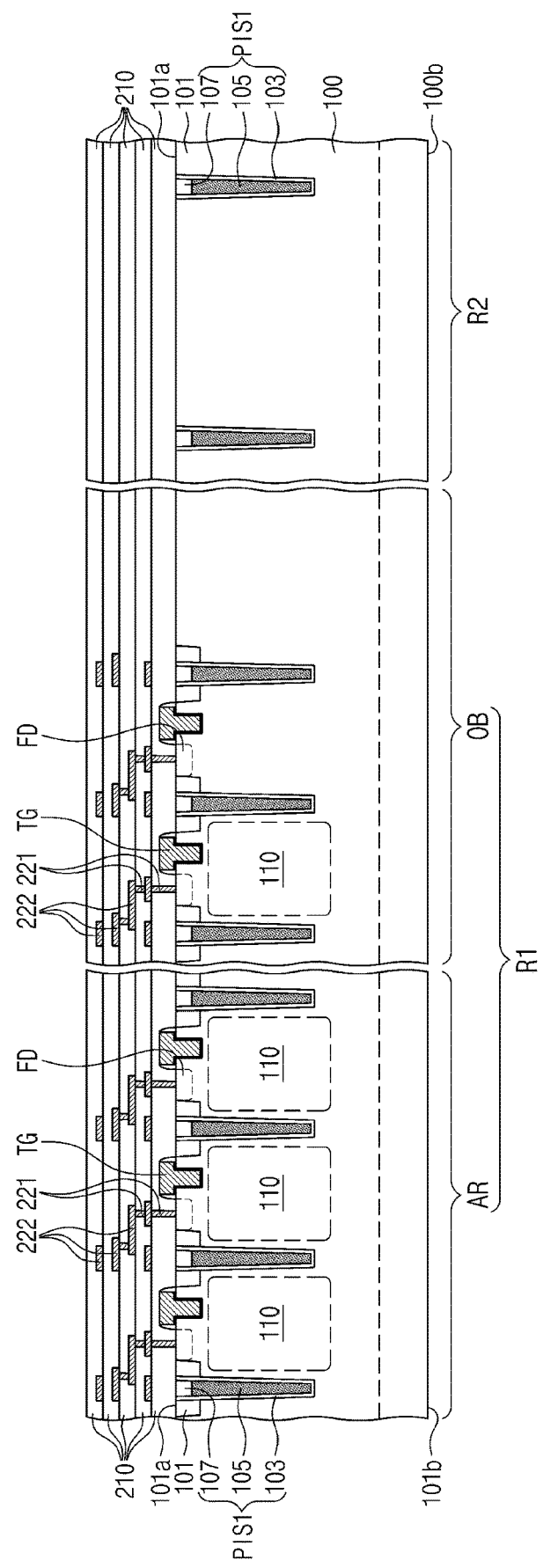
FIGS. 12, 13, 14, 15, 16 and 17 illustrate cross-sectional views taken along line A-A' of FIG. 1, showing a method of fabricating an image sensor according to an exemplary embodiment of the present inventive concept.

Referring to FIGS. 1 and 12, a semiconductor substrate 100 may be provided with a first conductivity type (e.g., p-type). For example, the semiconductor substrate 100 may include an epitaxial layer. The semiconductor substrate 100 may have a first surface 100a and a second surface 100b that are opposite to each other. The semiconductor substrate 100 may include a pad region R2 and a pixel array region R1 that includes a light-receiving region AR and a light-shielding region OB. The light-receiving region AR and the light-shielding region OB may each include a plurality of pixel regions PR.

On each pixel region PR, a device isolation layer 101 may be formed to adjoin the first surface 100a of the semiconductor substrate 100 and to provide active sections of the semiconductor substrate 100. The device isolation layer 101 may be formed by forming a shallow trench by patterning the first surface 100a of the semiconductor substrate 100 and then depositing a dielectric material in the shallow trench. The device isolation layer 101 may be formed before or after photoelectric conversion regions 110 are formed.

A first pixel separation structure PIS1 may be formed on the semiconductor substrate 100, providing the pixel regions PR.

The formation of the first pixel separation structure PIS1 may include forming a deep trench by patterning the first surface 100a of the semiconductor substrate 100, and forming a liner dielectric layer to conformally cover an inner wall of the deep trench. The formation of the first pixel separation structure PIS1 may further include depositing a semiconductor layer to fill the deep trench in which the liner dielectric layer is formed, and forming in the deep trench a liner dielectric pattern 103 and a semiconductor pattern 105 by planarizing the liner dielectric layer and the semiconductor pattern 105 to expose the first surface 100a of the semiconductor substrate 100. The liner dielectric pattern 103 may include, for example, one or more of silicon oxide, silicon nitride, and/or silicon oxynitride. The semiconductor pattern 105 may include one or more of an impurity-doped polysilicon layer and an undoped polysilicon layer.

Photoelectric conversion regions 110 may be formed in the semiconductor substrate 100. The semiconductor substrate 100 may be doped with impurities having a second conductivity type (e.g., n-type) different from the first conductivity type, and thus the photoelectric conversion regions 110 may be formed on corresponding pixel regions PR.

MOS transistors may be formed on the first surface 100a of the semiconductor substrate 100, constituting readout circuits. For example, transfer gate electrodes TG may be formed on the first surface 100a of the semiconductor substrate 100 with a gate dielectric layer between the semiconductor substrate 100 and each of the transfer gate electrodes TG. Gate electrodes of readout transistors may also be formed together with the transfer gate electrodes TG.

After the formation of the transfer gate electrodes TG, floating diffusion regions FD may be formed in the semiconductor substrate 100 on sides of the transfer gate electrodes TG. The floating diffusion regions FD may be formed by implanting impurities having the second conductivity type. In addition, source/drain impurity regions of the readout transistors may also be formed together with floating diffusion regions FD.

Interlayer dielectric layers 210 and wiring structures 221 and 222 may be formed on the first surface 100a of the semiconductor substrate 100. The interlayer dielectric layers 210 may cover transfer transistors and logic transistors. The interlayer dielectric layers 210 may be formed of a material having superior gap-fill properties and may have their planarized upper portions.

Contact plugs 221 may be formed to lie in the interlayer dielectric layers 210 and to have connection with the floating diffusion regions FD or the readout transistors. Metal lines 222 may be formed in the interlayer dielectric layers 210. The contact plugs 221 and the metal lines 222 may be formed of, for example, copper (Cu), aluminum (Al), tungsten (W), titanium (Ti), molybdenum (Mo), tantalum (Ta), titanium nitride (TiN), tantalum nitride (TaN), zirconium nitride (ZrN), tungsten nitride (WN), or any alloy thereof.

Figure 13:
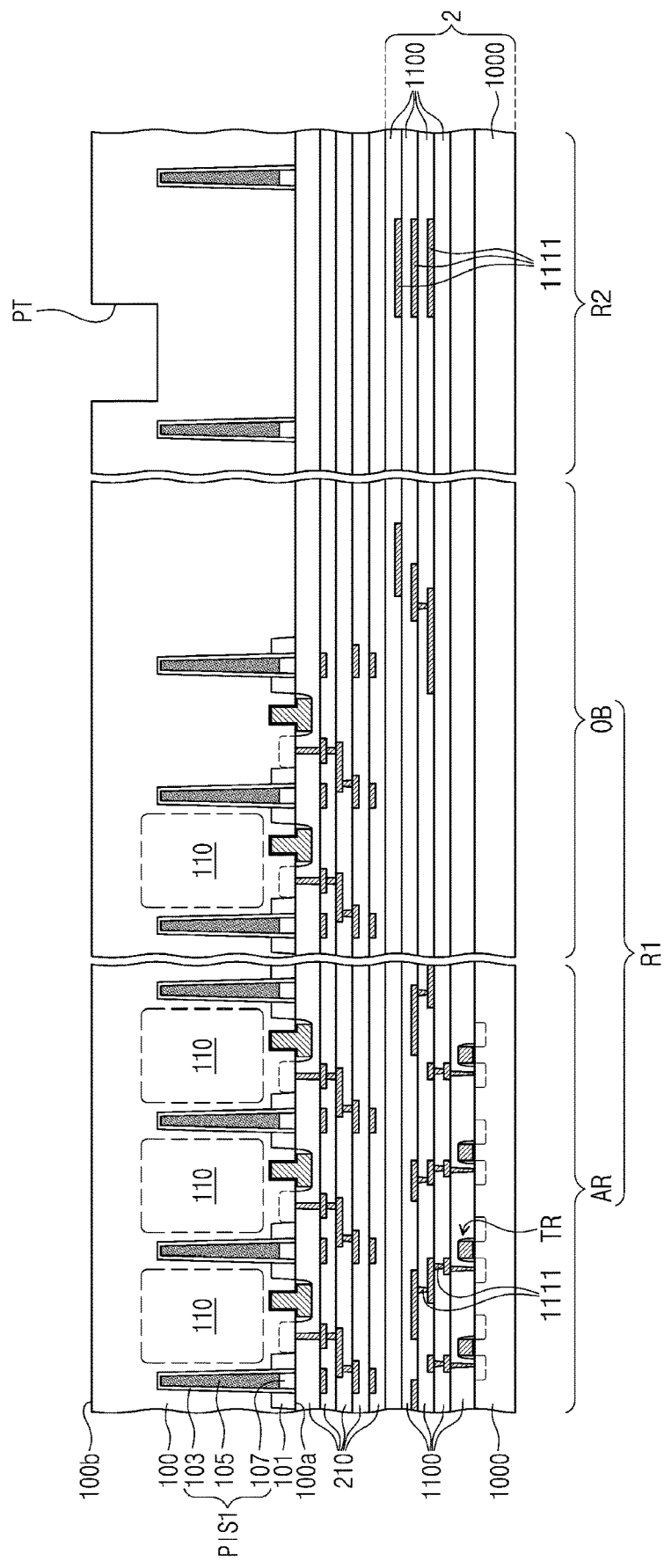

Referring to FIGS. 1 and 13, a logic chip 2 may be coupled to the first surface 100a of the semiconductor substrate 100.

The logic chip 2 may include a logic semiconductor substrate 1000, logic circuits TR, wiring structures 1111 connected to the logic circuits TR, and logic interlayer dielectric layers 1100. An interlayer dielectric layer 1100 of the logic chip 2 may be coupled to an interlayer dielectric layer 210 on the first surface 100a of the semiconductor substrate 100. For example, on the first surface 100a of the semiconductor substrate 100, an uppermost interlayer dielectric layer 1100 of the logic chip 2 may be coupled to a lowermost interlayer dielectric layer 210.

After the bonding of the logic chip 2, a thinning process may be performed to cause the semiconductor substrate 100 to have a reduced thickness. The thinning process may include a grinding or polishing process being executed on the second surface 100b of the semiconductor substrate 100. The semiconductor substrate 100 may be turned upside down to perform the thinning process thereon. The thinning process may remove a portion of the semiconductor substrate 100, and then an isotropic or anisotropic etching process may be performed to remove surface defects remaining on the semiconductor substrate 100.

For example, the semiconductor substrate 100 may include an epitaxial layer on a bulk silicon substrate, and may undergo the thinning process to remove the bulk silicon substrate and to leave a p-type epitaxial layer. In an exemplary embodiment of the present inventive concept, a value of about 8 µm to about 15 µm may be given a thickness of the semiconductor substrate 100 that remains after the thinning process.

After the thinning process, on the pad region R2, the second surface 100b of the semiconductor substrate 100 may be patterned to form a pad trench PT.

Figure 14:
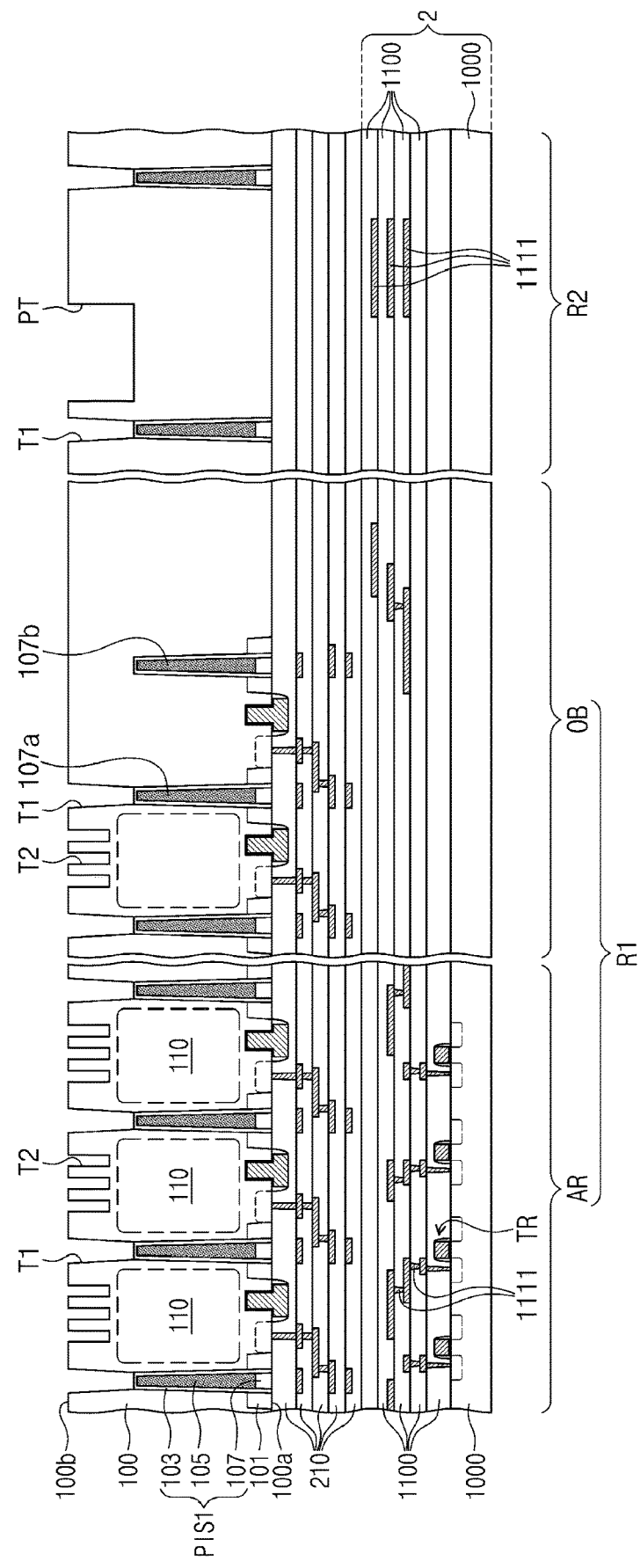

Referring to FIGS. 1 and 14, on the pixel array region. R1, the second surface 100b of the semiconductor substrate 100 may be patterned to form first and second trenches T1 and T2 at substantially the same time.

The formation of the first and second trenches T1 and T2 may include forming a mask pattern on the second surface 100b of the semiconductor substrate 100 and using the mask pattern as an etching mask to anisotropically etch the semiconductor substrate 100. When the first and second trenches T1 and T2 are foraged, the first trench T1 may expose the first pixel separation structure PIS1. The first trench T1 and the second trench 12 may have different widths from each, and different depths from each other. For example, the first trench T1 may have a width greater than that of the second trench T2, and the first trench T1 may have a depth greater than that of the second trench T2.

According to an exemplary embodiment of the present inventive concept, the first trench T1 may be formed on the pixel array region R1 and the pad region R2, and when the first trench T1 is formed, the semiconductor pattern 105 of the first pixel separation structure PIS1 may be exposed.

According to an exemplary embodiment of the present inventive concept, when the first trench T1 is formed, the linear dielectric pattern 103, disposed on the semiconductor pattern 105, of the first pixel separation structure PIS1 may be exposed.

On the light-shielding region OB, the first trench T1 may partially expose the first pixel separation structure PIS1. For example, on the light-shielding region OB, the first trench T1 may not be formed on a portion of the first pixel separation strut re PIS1.

Figure 15:
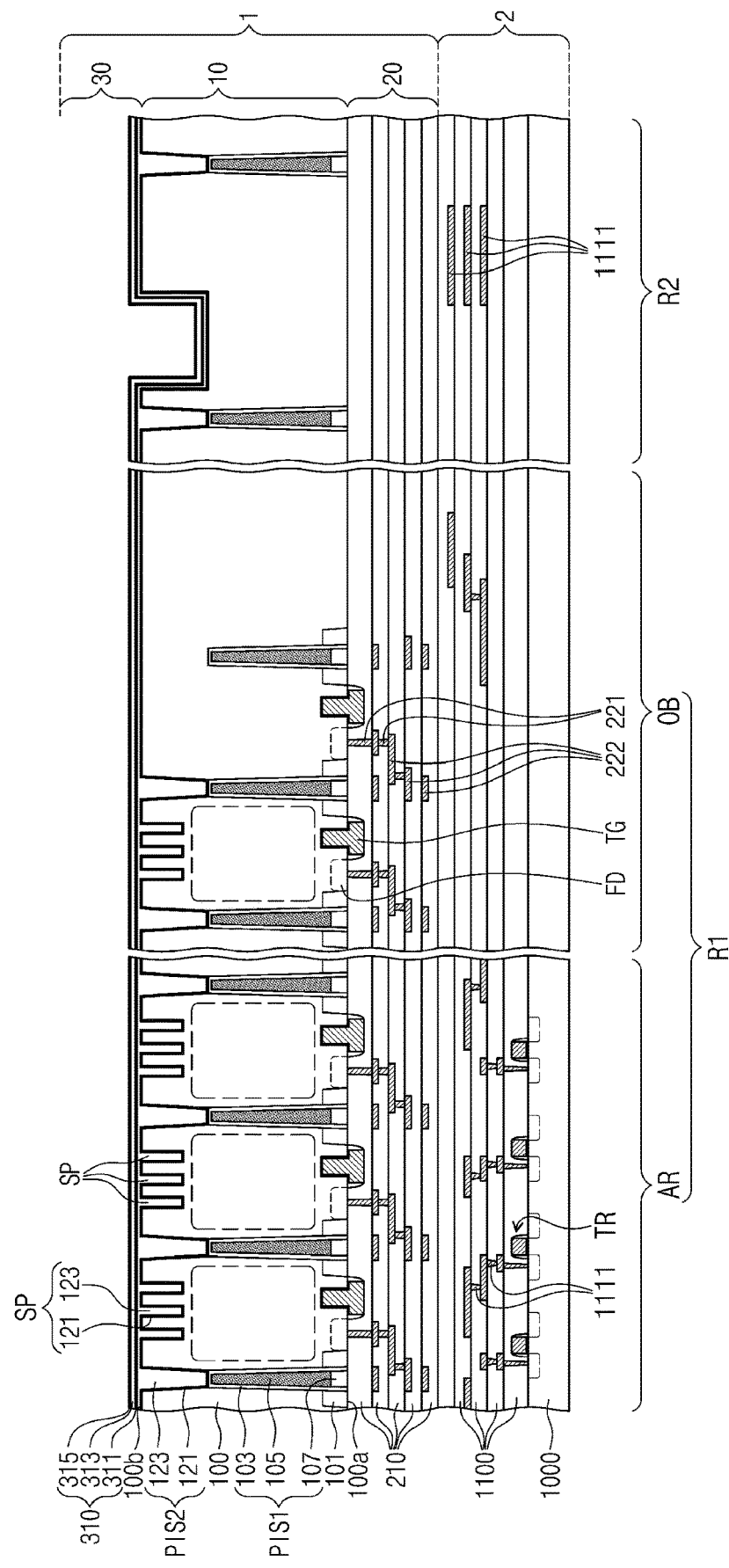

Referring to FIGS. 1 and 15, a surface dielectric layer 121 and a gap-fill dielectric layer 123 may be sequentially formed in the first and second trenches T1 and T2.

The surface dielectric layer 121 may be conformally deposited on surfaces of the first and second trenches T1 and T2 and on the second surface 100b of the semiconductor substrate 100. An atomic layer deposition (ALD) process may be performed to form the surface and gap-fill dielectric layers 121 and 123. The gap-fill dielectric layer 123 may fill the first and second trenches T1 and T2 in which the surface dielectric layer 121 is formed, and may have a substantially flat top surface. The surface and gap-fill dielectric layers 121 and 123 may include metal oxide, such as one or more of aluminum oxide and/or hafnium oxide. In addition, on the pad region R2, the surface and gap-fill dielectric layers 121 and 123 may conformally cover an inner wall of the pad trench PT.

A planarized dielectric layer 310 may be formed on a top surface of the gap-fill dielectric layer 123. The formation of the planarized dielectric layer 310 may include sequentially depositing a first planarized layer 311, a second planarized layer 313, and a third planarized layer 315. The first, second, and third planarized layers 311, 313, and 315 may be formed of a transparent dielectric material and may have different thicknesses from each other. The first, second, and third planarized layers 311, 313, and 315 may include, for example, metal oxide and/or silicon oxide.

Figure 16:
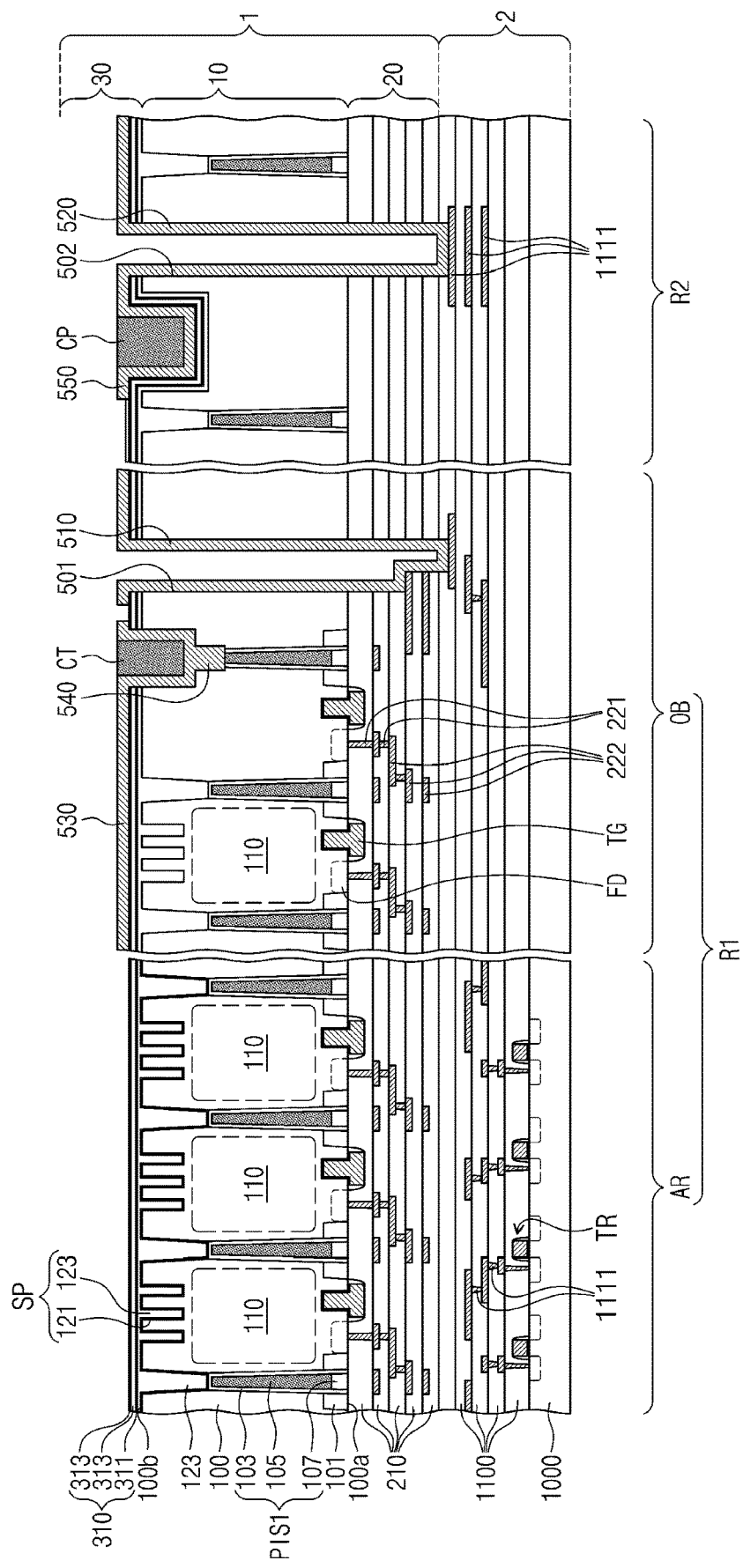

Referring to FIGS. 1 and 16, on the light-shielding region OB, a contact hole may be formed to penetrate a portion of the semiconductor substrate 100 and to expose a portion of the semiconductor pattern 105 included in the first pixel separation structure PIS1.

On the light-shielding region OB, a first through hole 501 may be formed to penetrate the semiconductor substrate 100 and to expose the wiring structure 1111 of the logic chip 2. On the pad region R2, a second through hole 502 may be formed to penetrate the semiconductor substrate 100 and to expose the wiring structure 1111 of the logic chip 2.

The first through hole 501 may have a first bottom surface and a second bottom surface at different levels from each other. The first bottom surface of the first through hole 501 may expose the metal line 222 of the readout circuit layer 20, and the second bottom surface of the first through hole 501 may expose the wiring structure 1111 of the logic chip 2.

Afterwards, a conductive layer may be deposited on the planarized dielectric layer 310. The conductive layer may conformally cover a surface of the planarized dielectric layer 310, an inner wall of the contact hole, an inner wall of the first through hole 501, and an inner wall of the second through hole 502. After the conductive layer is deposited, the conductive layer may undergo a patterning process to remove the conductive layer from the light-receiving region AR. The conductive layer may include metal, such as copper, tungsten, aluminum, titanium, tantalum, or any alloy thereof.

As the patterning process is performed on the conductive layer, a contact plug 540 may be formed in the contact hole, and on the light-shielding region OB, a light-shielding pattern 530 may be formed on the planarized dielectric layer 310. In addition, first and second through conductive patterns 510 and 520 may be formed in the first and second through holes 501 and 502, respectively.

The first through conductive pattern 510 may be electrically connected to the metal line 222 of the readout circuit layer 20 and to the wiring structure 1111 of the logic chip 2. As shown, the second through conductive pattern 520 may be electrically connected to a conductive pad CP. The second through conductive pattern 520 may extend into the second through hole 502 and may cover the second through hole 502. For example, the second through conductive pattern 520 may conformally cover a sidewall and a bottom surface of the second through hole 502. The second through conductive pattern 520 may be electrically connected to the wiring structure 1111 of the logic chip 2.

A contact plug 540 may be provided on the second surface 100*b* of the semiconductor substrate 100 on the light-shielding region OB. A contact trench may be formed on the second surface 100*b* of the semiconductor substrate 100, and the contact plug 540 may be provided in the contact trench.

The contact pad CT may be connected to the contact plug 540. The contact pad CT may include a conductive material different from that of the contact plug 540. For example, the contact pad CT may include aluminum. The contact pad CT may be electrically connected to the semiconductor pattern 105 of the first pixel separation structure PIS1. A negative bias may be applied thorough the contact pad CT to the semiconductor pattern 105 of the first pixel separation structure PIS1, and a predetermined bias may be transmitted to the pixel array region R1.

On the pad region R2, the conductive pad CP may be buried in the pad trench of the semiconductor substrate 100. The conductive pad. CP may include metal, such as aluminum, copper, tungsten, titanium, tantalum, or any alloy thereof. For example, a bonding wire may be formed on and coupled to the conductive pad CP in an image sensor mounting process. The conductive pad CP may be electrically connected to an external device via the bonding wire.

Figure 17:
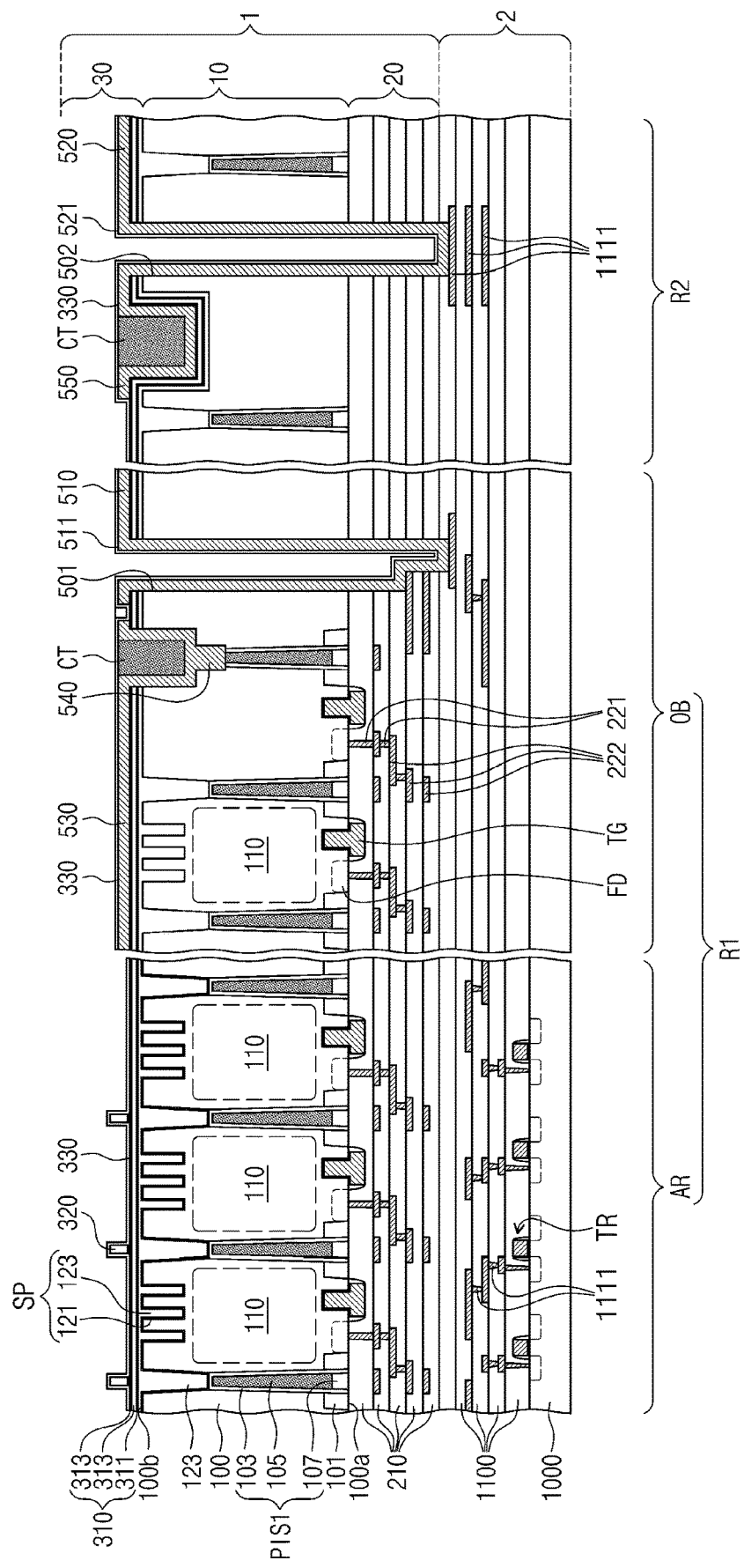

Referring to FIGS. 1 and 17, on the light-receiving region AR, a grid structure 320 may be formed on the planarized dielectric layer 310.

When viewed from a plan view, as discussed above, the grid structure 320 may overlap the first and second pixel separation structures PIS1 and PIS2 in the semiconductor substrate 100.

The formation of the grid structure 320 may include sequentially forming a light-shielding layer and a low-refractive layer on the planarized dielectric layer 310, forming a mask pattern on the low-refractive layer, and using the mask pattern as an etching mask to sequentially etch the low-refractive layer and the light-shielding layer to expose the planarized dielectric layer 310.

In an exemplary embodiment of the present inventive concept, the grid structure 320 on the light-receiving region AR may be formed simultaneously with the light-shielding pattern 530 on the light-shielding region OB. In an exemplary embodiment of the present inventive concept, the grid structure 320 may also be formed on the light shielding region OB after the light-shielding pattern 530 is formed on the light-shielding region. OB.

When the grid structure 320 is formed, buried dielectric patterns may fill the first through hole 501 in which the first through conductive pattern 510 is formed and the second through hole 502 in which the second through conductive pattern 520 is formed. The buried dielectric patterns may include the same material of the grid structure 320. For example, the buried dielectric patterns may include a relatively low-refractive material and may have dielectric characteristics.

A protection layer 330 may be formed to conformally cover a surface of the grid structure 320 and a top surface of the planarized dielectric layer 310 exposed by the grid structure 320. The protection layer 330 may be formed by, for example, performing a chemical vapor deposition process or an atomic layer deposition process. The protection layer 330 may be formed of a single layer or multiple layers. The protection layer 330 may include one or more of an aluminum oxide layer and/or a silicon carbon oxide layer.

Referring to FIGS. 11A and 11B, a microlens array 340 including microlenses that correspond to the pixel regions PR may be formed.

The microlens array 340 may be formed by forming an optical transmissive photoresist layer, partially patterning the photoresist layer to form photoresist patterns that correspond to the pixel regions PR, and reflowing the photoresist patterns. Thus, the microlenses may be formed with upwardly convex shapes having a substantially constant curvature. For example, after the microlenses are formed, a uniformly thick planarized member may be formed below the microlenses.

An organic layer 345 may be formed on the light-shielding region OB and the pad region R2. The organic layer 345 may be connected to the microlens array 340. The organic layer 345 may include the same material as that of the microlens array 340. The organic layer 345 may expose the conductive pad CP on the pad region R2.

After the formation of microlens array 340, a passivation layer 350 may be formed to conformally cover surfaces of the microlens array 340. The passivation layer 350 may be formed of, for example, inorganic oxide.

According to an exemplary embodiment of the present inventive concept, a first pixel separation structure may be provided adjacent to a first surface of a semiconductor substrate, and a second pixel separation structure may be provided adjacent to a second surface of the semiconductor substrate. It may thus be possible to increase a thickness of the semiconductor substrate in which photoelectric conversion regions are provided, and unit pixels may have increased quantum efficiency, or optical absorption efficiency of incident light (e.g., infrared light).

Furthermore, the first and second pixel separation structures may divide adjacent unit pixels from each other, and therefore crosstalk issues may be reduced between neighboring unit pixels.

While the present inventive concept has been particularly shown and described with reference to exemplary embodiments thereof, it will be apparent to those of ordinary skill in the art that various changes in form and detail may be made thereto without departing from the spirit and scope of the present inventive concept.

What is claimed is:

1. An image sensor, comprising:
a semiconductor substrate that has a first surface and a second surface opposite to each other, wherein the semiconductor substrate includes:
 a first trench that vertically extends from the first surface of the semiconductor substrate and provides a pixel region, and
 a second trench that vertically extends from the first surface of the semiconductor substrate and is disposed on the pixel region;
a pixel separation structure that vertically extends from the second surface of the semiconductor substrate and overlaps the first trench; and
a gap-fill dielectric layer disposed on the first surface of the semiconductor substrate, wherein the gap-fill dielectric layer includes a pixel separation part and a scattering pattern part, wherein the pixel separation part is disposed in the first trench, and the scattering pattern part is disposed in the second trench.

2. The image sensor of claim 1, wherein a depth of the first trench is different from a depth of the second trench.

3. The image sensor of claim 1, further comprising a surface dielectric layer disposed between the gap-fill dielectric layer and inner walls of the first and second trenches.

4. The image sensor of claim 1, wherein the gap-fill dielectric layer includes a dielectric material different from a dielectric material of the pixel separation structure.

5. The image sensor of claim 1, wherein
the first trench includes a plurality of first parts and a plurality of second parts, wherein the plurality of first parts extend in a first direction, and the plurality of second parts extend in a second direction intersecting the first direction, wherein the plurality of first parts are spaced apart from the plurality of second parts, and
wherein the pixel separation structure includes a plurality of third parts and a plurality of fourth parts, wherein the plurality of third parts extend in the first direction, and the plurality of fourth parts extend in the second direction, wherein the plurality of fourth parts cross the plurality of third parts.

6. The image sensor of claim 1, wherein the first trench includes a plurality of first parts and a plurality of second parts, wherein the plurality of first parts extend in a first direction, and the plurality of second parts extend in a second direction intersecting the first direction,
wherein each of the plurality of first parts includes a first portion and a second portion, wherein the first portion is adjacent to the plurality of second parts, and the second portion is spaced apart from the plurality of second parts, and
wherein the first portion has a first width, and the second portion has a second width greater than the first width.

7. The image sensor of claim 1, wherein the pixel separation structure includes:
a semiconductor pattern that extends from the second surface of the semiconductor substrate toward the pixel separation part of the gap-fill dielectric layer; and
a liner dielectric pattern disposed between the semiconductor pattern and the semiconductor substrate,
wherein the pixel separation part of the gap-fill dielectric layer is disposed on the semiconductor pattern of the pixel separation structure.

8. The image sensor of claim 1, wherein
the pixel separation part of the gap-fill dielectric layer has a first width, and
the pixel separation structure has a second width greater than the first width.

9. The image sensor of claim 1, wherein a first vertical length of the first trench is substantially the same as or less than a second vertical length of the pixel separation structure.

10. An image sensor, comprising:
a semiconductor substrate that has a first surface and a second surface opposite to each other;
a first pixel separation structure that vertically extends from the first surface of the semiconductor substrate and provides a pixel region, wherein the first pixel separation structure includes:
 a plurality of first parts that extend in a first direction,
 a plurality of second parts that extend in a second direction intersecting the first direction, and
 a plurality of first intersection parts that are connected to the plurality of first and the plurality of second parts; and
a second pixel separation structure that overlaps the first pixel separation structure and vertically extends from the second surface of the semiconductor substrate, wherein the second pixel separation structure includes:
 a plurality of third parts that extend in the first direction,
 a plurality of fourth parts that extend in the second direction, and
 a plurality of second intersection parts that are connected to the plurality of third and the plurality of fourth parts,
wherein the plurality of first and the plurality of second parts have a first vertical length, and the first intersection parts have a second vertical length different from the first vertical length, and
wherein the plurality of third and the plurality of fourth parts have a third vertical length, and that the plurality of second intersection parts have a fourth vertical length different from the third vertical length.

11. The image sensor of claim 10, further comprising a plurality of scattering patterns penetrating the second surface of the semiconductor substrate on the pixel region, and wherein the plurality of scattering patterns include a dielectric material the same as a dielectric material of the second pixel separation structure.

12. The image sensor of claim 11, wherein the scattering patterns have a vertical length different from the third vertical length.

13. The image sensor of claim 10, wherein the second pixel separation structure includes a surface dielectric layer and a gap-fill dielectric layer, wherein the surface dielectric layer is in contact with the semiconductor substrate, and the gap-fill dielectric layer is disposed on the surface dielectric layer.

14. The image sensor of claim 10, wherein the second pixel separation structure is in contact with the first pixel separation structure.

15. The image sensor of claim 10, wherein the first pixel separation structure includes:
   a semiconductor pattern that extends toward the second pixel separation structure from the first surface of the semiconductor substrate; and
   a liner dielectric pattern between the semiconductor pattern and the semiconductor substrate,
   wherein the second pixel separation structure overlaps the semiconductor pattern of the first pixel separation structure.

16. The image sensor of claim 10, wherein each of the third parts of the second pixel separation structure includes a first portion and a second portion, wherein the first portion is adjacent to the fourth parts, and the second portion is spaced apart from the fourth parts, and
   wherein the first portion has a first width, and the second portion has a second width greater than the first width.

17. An image sensor, comprising:
   a semiconductor substrate that has a first surface and a second surface opposite to each other, wherein the semiconductor substrate includes a light-receiving region, a light-shielding region, and a pad region;
   a first pixel separation structure that vertically extends from the first surface of the semiconductor substrate on the light-receiving, light-shielding, and pad regions;
   a second pixel separation structure that vertically extends from the second surface of the semiconductor substrate on the light-receiving, light-shielding, and pad regions, wherein the second pixel separation structure overlaps the first pixel separation structure;
   a plurality of photoelectric conversion regions in the semiconductor substrate on the light-receiving and light-shielding regions;
   a plurality of scattering patterns in the second surface of the semiconductor substrate on the light-receiving and light-shielding regions, wherein the scattering patterns overlap the plurality of photoelectric conversion regions;
   a contact plug disposed on a portion of the light-shielding region, wherein the contact plug is adjacent to the second surface of the semiconductor substrate and is in contact with a portion of the first pixel separation structure;
   a conductive pad disposed on the second surface of the semiconductor substrate and on the pad region;
   a grid structure disposed on the second surface of the semiconductor substrate; and
   a microlens array disposed on the grid structure.

18. The image sensor of claim 17, wherein the second pixel separation structure and the scattering patterns include a gap-fill dielectric layer.

19. The image sensor of claim 17, wherein a vertical length of the second pixel separation structure is different from a vertical length of the scattering patterns.

20. The image sensor of claim 17,
   wherein the first pixel separation structure includes a plurality of first parts that extend in a first direction, a plurality of second parts that extend in a second direction intersecting the first direction, and a plurality of first intersection parts that are connected to the plurality of first and the plurality of second parts, and
   wherein the plurality of first and the plurality of second parts of the first pixel separation structure have a first vertical length, and the plurality of first intersection parts of the first pixel separation structure have a second vertical length different from the first vertical length, and
   wherein the second pixel separation structure includes a plurality of third parts that extend in the first direction, a plurality of fourth parts that extend in the second direction, and a plurality of second intersection parts that are connected to the plurality of third and the plurality of fourth parts,
   wherein the plurality of third and fourth parts have a third vertical length, and the plurality of second intersection parts have a fourth vertical length different from the third vertical length.

* * * * *